US011776918B2

(12) United States Patent
Choi et al.

(10) Patent No.: US 11,776,918 B2
(45) Date of Patent: Oct. 3, 2023

(54) SEMICONDUCTOR PACKAGE HAVING STIFFENING STRUCTURE

(71) Applicant: Samsung Electronics Co., Ltd., Suwon-si (KR)

(72) Inventors: Eunkyoung Choi, Hwaseong-si (KR); Suchang Lee, Seoul (KR); Yunseok Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/705,770

(22) Filed: Mar. 28, 2022

(65) Prior Publication Data

US 2022/0223543 A1    Jul. 14, 2022

Related U.S. Application Data

(63) Continuation of application No. 16/848,106, filed on Apr. 14, 2020, now Pat. No. 11,315,886.

(30) Foreign Application Priority Data

Nov. 15, 2019   (KR) .................... 10-2019-0146833

(51) Int. Cl.
*H01L 23/16*    (2006.01)
*H01L 23/00*    (2006.01)
(Continued)

(52) U.S. Cl.
CPC ............ *H01L 23/562* (2013.01); *H01L 23/16* (2013.01); *H01L 23/49838* (2013.01);
(Continued)

(58) Field of Classification Search
CPC ............ H01L 25/0652; H01L 25/0655; H01L 25/0657; H01L 23/16; H01L 23/18;
(Continued)

(56) References Cited

U.S. PATENT DOCUMENTS 8,922,230 B2   12/2014   Wang et al.
9,824,988 B1   11/2017   Lee et al.
(Continued)

FOREIGN PATENT DOCUMENTS

DE   102017122096 A1   5/2018
DE   102017122831 A1   5/2018

OTHER PUBLICATIONS

Office Action dated Aug. 30, 2021 for corresponding U.S. Appl. No. 16/848,106.
(Continued)

*Primary Examiner* — Phat X Cao
*Assistant Examiner* — William H Anderson
(74) *Attorney, Agent, or Firm* — Harness, Dickey & Pierce, P.L.C.

(57) ABSTRACT

A semiconductor package having a stiffening structure is disclosed. The semiconductor package includes a substrate, an interposer on the substrate, and a first logic chip, a second logic chip, memory stacks and stiffening chips, all of which are on the interposer. The first logic chip and the second logic chip are adjacent to each other. Each memory stack is adjacent to a corresponding one of the first logic chip and the second logic chip. Each memory stack includes a plurality of stacked memory chips. Each stiffening chip is disposed between corresponding ones of the memory stacks, to be aligned and overlap with a boundary area between the first logic chip and the second logic chip.

20 Claims, 17 Drawing Sheets

(51) Int. Cl.
　　*H01L 23/498*　　(2006.01)
　　*H01L 25/065*　　(2023.01)
　　*H01L 25/18*　　(2023.01)

(52) U.S. Cl.
　　CPC .......... *H01L 25/0652* (2013.01); *H01L 25/18* (2013.01); *H01L 2225/06513* (2013.01); *H01L 2225/06517* (2013.01); *H01L 2225/06541* (2013.01); *H01L 2225/06586* (2013.01)

(58) Field of Classification Search
　　CPC ... H01L 23/42; H01L 23/433; H01L 23/4334; H01L 2924/35; H01L 2924/351; H01L 2924/3511; H01L 23/562; H01L 23/36; H01L 23/373; H01L 23/3738
　　See application file for complete search history.

(56) References Cited

U.S. PATENT DOCUMENTS

| | | |
|---|---|---|
| 9,865,567 B1 | 1/2018 | Chaware et al. |
| 10,020,267 B2 | 7/2018 | Rahman et al. |
| 10,304,784 B2 | 5/2019 | Kim et al. |
| 10,861,799 B1 | 12/2020 | Wu et al. |
| 11,004,803 B2 | 5/2021 | Yu et al. |
| 2012/0018871 A1 | 1/2012 | Lee et al. |
| 2016/0079135 A1 | 3/2016 | Huang et al. |
| 2016/0336296 A1 | 11/2016 | Jeong et al. |
| 2016/0358865 A1 | 12/2016 | Shih et al. |
| 2018/0138101 A1 | 5/2018 | Yu et al. |
| 2018/0138151 A1 | 5/2018 | Shih et al. |
| 2018/0323160 A1 | 11/2018 | Shih et al. |
| 2019/0096825 A1 | 3/2019 | Kim et al. |
| 2019/0122949 A1 | 4/2019 | Lee |
| 2019/0237412 A1 | 8/2019 | Lee |
| 2019/0319626 A1 | 10/2019 | Dabral et al. |
| 2020/0185357 A1* | 6/2020 | Byun .................. H01L 23/3171 |
| 2021/0305122 A1* | 9/2021 | Lai ...................... H01L 23/5385 |
| 2021/0305227 A1* | 9/2021 | Chen ..................... H01L 23/562 |
| 2021/0366889 A1* | 11/2021 | Lin .................. H01L 23/49816 |

OTHER PUBLICATIONS

Notice of Allowance dated Dec. 22, 2021 for corresponding U.S. Appl. No. 16/848,106.

* cited by examiner

SEMICONDUCTOR PACKAGE HAVING STIFFENING STRUCTURE

CROSS-REFERENCE TO THE RELATED APPLICATION

The present application is a continuation of and claims priority under 35 U.S.C. § 120 to U.S. patent application Ser. No. 16/848,106, filed on Apr. 14, 2020, which claims priority to Korean Patent Application No. 10-2019-0146833, filed on Nov. 15, 2019, in the Korean Intellectual Property Office, the disclosure of which is incorporated herein by reference in its entirety.

BACKGROUND

1. Field

Some example embodiments of the disclosure relate to semiconductor packages including logic chips, memory chips, and a stiffening structure, mounted on an interposer of a substrate.

2. Description of the Related Art

For next-generation high-performance communication appliances, a semiconductor package including a logic device and high-bandwidth memory (HBM) devices are being studied. Such semiconductor packages may include an interposer mounted on a substrate, and a logic chip and a plurality of memory stacks mounted on the interposer. In particular, semiconductor packages designed to be suitable for mobile communication are manufactured to be thin and, as such, may be very weak against external physical stress, such as warpage. Further, warpage of chips may easily occur in an extension direction of boundary areas (or boundary lines) of the chips. In this case, the resultant semiconductor package may be physically or electrically damaged.

SUMMARY

Some example embodiments of the disclosure provide packages having a stiffening structure capable of avoiding or limiting warpage.

Some example embodiments of the disclosure also provide stiffening structures capable of protecting constituent elements from physical impact.

Various problems to be solved by some example embodiments of the disclosure will be concretely described in the specification.

A semiconductor package according to an embodiment of the disclosure may include a substrate, an interposer on the substrate, and a first logic chip and a second logic chip on the interposer, the first logic chip and the second logic chip are side-by-side so as to be adjacent to each other, memory stacks including a plurality of stacked memory chips, each memory stack is adjacent to a corresponding one of the first logic chip and the second logic chip, the memory stacks on the interposer, and stiffening chips on the interposer, the stiffening chips between corresponding ones of the memory stacks, the stiffening chips aligned with and overlapping a boundary area between the first logic chip and the second logic chip.

A semiconductor package according to some example embodiments of the disclosure may include a substrate, an interposer on the substrate, first and second logic chips on the interposer such that the first and second logic chips are adjacent to each other, first memory stacks at opposite side surfaces of the first logic chip, and second memory stacks at opposite side surfaces of the second logic chip, and stiffening chips between the first memory stacks and the second memory stacks. The first and second logic chips may be electrically connected through a wiring inside the interposer. A minimum distance between the first logic chip and the second logic chip may be smaller than a minimum distance between the first memory stacks and the second memory stacks. The stiffening chips may be adjacent to a boundary area between the first logic chip and the second logic chip and aligned with an extension line of the boundary area. The stiffening chips may have a greater width than the boundary area.

A semiconductor package according to some example embodiments of the disclosure may include a substrate, an interposer on the substrate, a plurality of logic chips on the interposer, adjacent to one another within 100 mm, and the logic chips are electrically connected through the interposer, a plurality of memory stacks on the interposer, each of the memory stacks includes a plurality of stacked memory chips, and through vias extending vertically through the memory chips, and a plurality of stiffening chips on the interposer, longer sides of the stiffening chips are parallel to shorter sides of the memory stacks, shorter sides of the stiffening chips have a length corresponding to ½ or less of a length of longer sides of the memory stacks, and each of the stiffening chips has a greater width than a boundary area between corresponding ones of the logic chips such that the stiffening chip horizontally overlaps with portions of the corresponding logic chips, and a molding compound surrounding side surfaces of the interposer, side surfaces of the logic chips, side surfaces of the memory stacks and side surfaces of the stiffening chips.

Various effects according to example embodiments of the disclosure will be described in the specification.

DETAILED DESCRIPTION OF EXAMPLE EMBODIMENTS

Figure 1A:
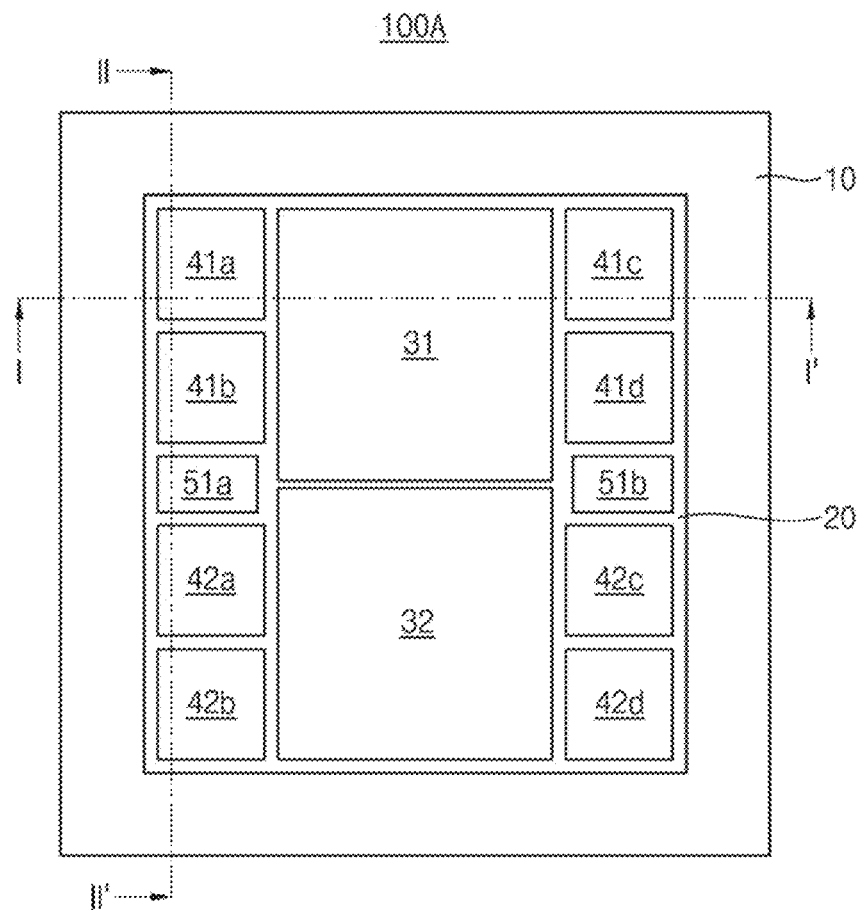
FIG. 1A is a projected top view schematically showing a semiconductor package according to some example embodiments of the disclosure.

FIG. 1A is a projected top view schematically showing a semiconductor package 100A according to some example embodiments of the disclosure.

Referring to FIG. 1A, the semiconductor package 100A according to some example embodiments of the disclosure may include an interposer 20 disposed on a substrate 10, upper and lower logic chips 31 and 32, a plurality of memory stacks 41a to 41d and 42a to 42d, and stiffening chips 51a and 51b.

The interposer 20 may be mounted on the substrate 10. Each of the substrate 10 and the interposer 20 may include one of a printed circuit board (PCB), a flexible PCB (FPCB), a silicon-based substrate, a ceramic substrate, a glass substrate, and/or an insulating circuit board. In some example embodiments, the substrate 10 may include a PCB or an FPCB. The interposer 20 may include a silicon-based substrate or a re-distribution structure.

The upper and lower logic chips 31 and 32 may be disposed side-by-side in a column direction such that upper and lower logic chips 31 and 32 are disposed adjacent to each other. Each of the upper and lower logic chips 31 and 32 may include one of a core processor, an application specific integrated circuit (ASIC), a mobile application processor (AP) and/or other processing chips. The terms "upper" and "lower" are used to distinguish the logic chips 31 and 32 from each other in the drawings. The upper and lower logic chips 31 and 32 may be horizontally disposed at the same level.

The memory stacks 41a to 41d and 42a to 42d may include first to fourth upper memory stacks 41a to 41d disposed side-by-side with respect to the upper logic chip 31 in a row direction, and first to fourth lower memory stacks 42a to 42d disposed side-by-side with respect to the lower logic chip 32 in the row direction. The row direction and the column direction are relative to each other, and may be interchanged with each other.

The first to fourth upper memory stacks 41a to 41d may be symmetrically disposed in parallel in the row direction at opposite sides of the upper logic chip 31. In detail, the first and second upper memory stacks 41a and 41b may be disposed at a first side surface of the upper logic chip 31, for example, at a left side of the upper logic chip 31, whereas the third and fourth memory stacks 41c and 41d may be disposed at a second side surface of the upper logic chip 31, for example, at a right side of the upper logic chip 31. The first and second upper memory stacks 41a and 41b may be aligned with each other in the column direction while being disposed side-by-side in the column direction. Similarly, the third and fourth upper memory stacks 41c and 41d may be aligned with each other in the column direction while being disposed side-by-side in the column direction. Accordingly, the first and third upper memory stacks 41a and 41c may be disposed at a higher level than the second and fourth upper memory stacks 41b and 41d.

The first to fourth lower memory stacks 42a to 42d may be symmetrically disposed in parallel in the row direction at opposite sides of the lower logic chip 32. In detail, the first and second lower memory stacks 42a and 42b may be disposed at a first side surface of the lower logic chip 32, for example, at a left side of the lower logic chip 32, whereas the third and fourth memory stacks 42c and 42d may be disposed at a second side surface of the lower logic chip 32, for example, at a right side of the lower logic chip 32. The first and second lower memory stacks 42a and 42b may be aligned with each other in the column direction while being disposed side-by-side in the column direction. Similarly, the third and fourth lower memory stacks 42c and 42d may be aligned with each other in the column direction while being disposed side-by-side in the column direction. Accordingly, the first and third lower memory stacks 42a and 42c may be disposed at a higher level than the second and fourth lower memory stacks 42b and 42d.

The stiffening chips 51a and 52b may be disposed to be aligned with a boundary area (boundary line) between the upper logic chip 31 and the lower logic chip 32 in the row direction while overlapping with the boundary area (boundary line) in the row direction. The stiffening chips 51a and 51b may have a greater width than the boundary area (boundary line) between the upper logic chip 31 and the lower logic chip 32. Accordingly, the stiffening chips 51a and 51b may overlap with a portion of the upper logic chip 31 and a portion of the lower logic chip 32 in the row direction.

The stiffening chips 51a and 51b may include a first stiffening chip 51a disposed at a left side of the boundary area (boundary line) between the upper logic chip 31 and the lower logic chip 32, and a second stiffening chip 51b disposed at a right side of the boundary area (boundary line) between the upper logic chip 31 and the lower logic chip 32. The first stiffening chip 51a may be aligned with the first and second upper memory stacks 41a and 41b and the first and second lower memory stacks 42a and 42b in the column direction. The second stiffening chip 51b may be aligned with the third and fourth upper memory stacks 41c and 41d and the third and fourth lower memory stacks 42c and 42d in the column direction. For example, the first stiffening chip 51a may be disposed between the second upper memory stack 41b and the first lower memory stack 42a, whereas the second stiffening chip 51b may be disposed between the fourth upper memory stack 41d and the third lower memory stack 42c. The stiffening chips 51a and 51b may be smaller than the memory stacks 41a to 41d and 42a to 42d. Shorter sides of the stiffening chips 51a and 51b have a smaller length than a length of longer sides of the memory stacks 41a to 41d and 42a to 42d such that the shorter-side length is ½ or less of the longer-side length. Longer sides of the stiffening chips 51a and 51b may have a smaller length than shorter sides of the memory stacks 41a to 41d and 42a to 42d. The longer sides of the stiffening chips 51a and 51b may be parallel with the shorter sides of the memory stacks 41a to 41d and 42a to 42d. Portions of the shorter sides of the stiffening chips 51a and 51b may be aligned with portions of the memory stacks 41a to 41d and 42a to 42d.

The upper logic chip 31 and the lower logic chip 32 may be disposed to be spaced apart from each other or adjacent to each other by a distance of about 0.04 to 0.08 mm. In some example embodiments, the upper logic chip 31 and the lower logic chip 32 may be disposed to be spaced apart from each other or adjacent to each other by a distance of about 0.06 mm. That is, the logic chips 31 and 32 may be disposed to be very closely adjacent to each other. The logic chips 31 and 32 and the memory stacks 41a to 41d and 42a to 42d may be disposed to be spaced apart from each other or adjacent to each other by a distance of about 0.5 to 0.9 mm. In some example embodiments, the logic chips 31 and 32 and the memory stacks 41a to 41d and 42a to 42d may be disposed to be spaced apart from each other or adjacent to each other by a distance of about 0.7 mm.

When the terms "about" or "substantially" are used in this specification in connection with a numerical value, it is intended that the associated numerical value include a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

For example, a first gap (e.g., a first minimum distance) between the logic chips 31 and 32 may be smaller than a second gap (a second minimum distance) between one of the logic chips 31 and 32 and adjacent one of the memory stacks 41a to 41d and 42a to 42d. A third gap (a third minimum distance) between one the logic chips 31 and 32 and adjacent one of the stiffening chips 51a and 51b may be greater than the second gap (the second minimum distance). For example, the memory stacks 41a to 41d and 42a to 42d may be disposed nearer to the logic chips 31 and 32 than the stiffening chips 51a and 51b, respectively. A fourth gap (a fourth minimum distance) between one of the stiffening chips 51a and 51b and adjacent one of the memory stacks 41a to 41d and 42a to 42d may be smaller than a fifth gap (a fifth minimum distance) between adjacent two of the memory stacks 41a to 41d and 42a to 42d.

Figure 1B:
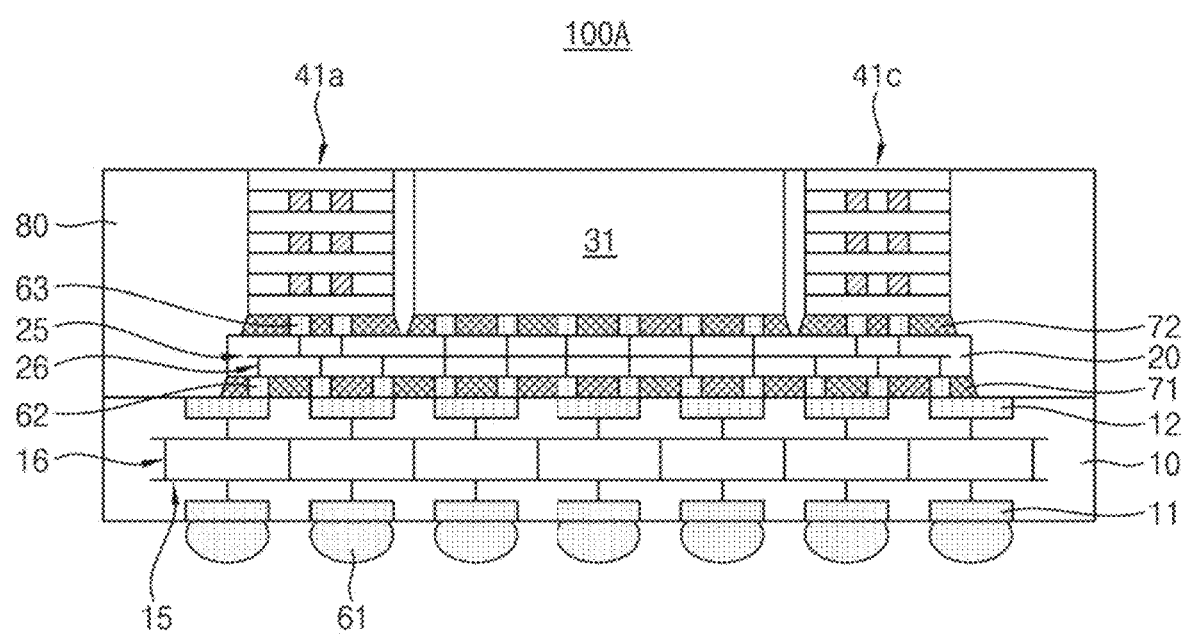
FIG. 1B is a cross-sectional view or a projected side view of the semiconductor package shown in FIG. 1A, taken along line I-I' in FIG. 1A.
Figure 1C:
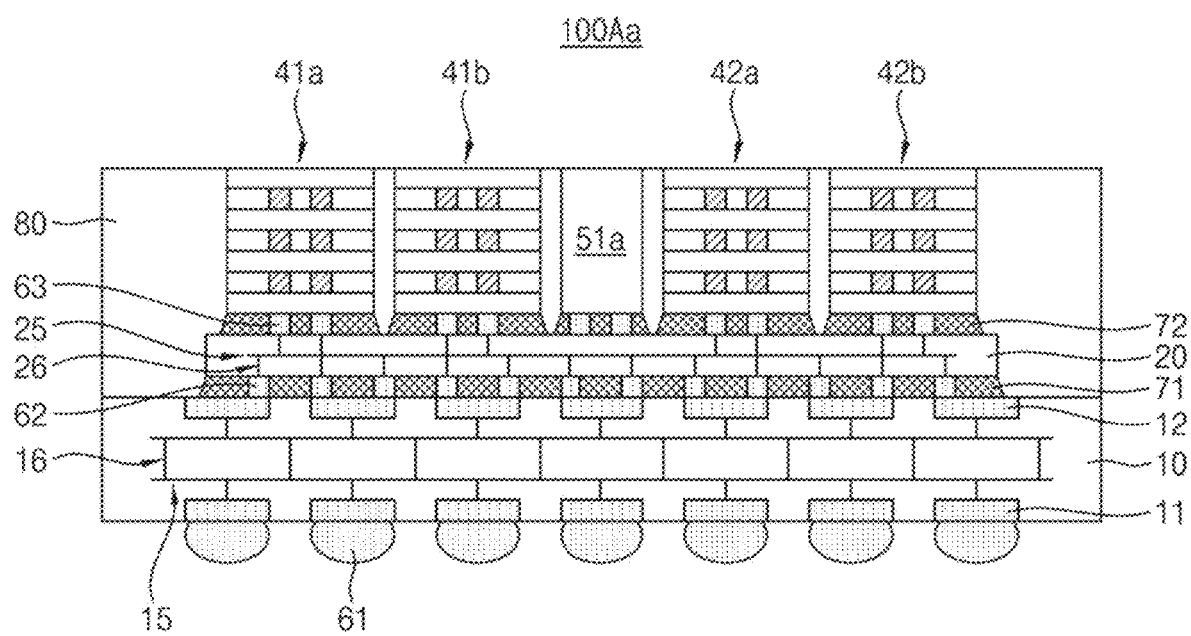
FIGS. 1C and 1D are cross-sectional views or projected side views of the semiconductor package shown in FIG. 1A, taken along line II-IF in FIG. 1A.
Figure 1D:
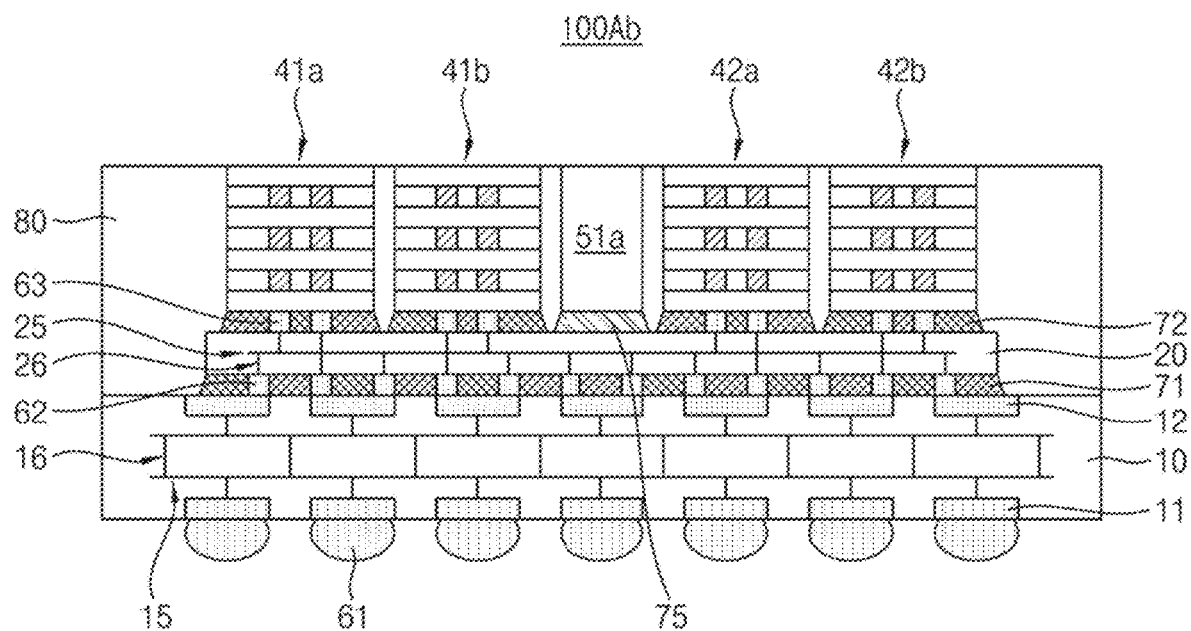

FIG. 1B is a cross-sectional view or a projected side view of the semiconductor package 100A shown in FIG. 1A, taken along line I-I' in FIG. 1A. FIGS. 1C and 1D are cross-sectional views or projected side views of the semiconductor package 100A shown in FIG. 1A, taken along line II-IF in FIG. 1A.

Referring to FIGS. 1A to 1D, the semiconductor package 100A, 100Aa or 100Ab according to some example embodiments of the disclosure may include the interposer 20 disposed on the substrate 10, the logic chips 31 and 32, the memory stacks 41a to 41d and 42a to 42d, the stiffening chips 51a and 51b, and a molding compound 80. The semiconductor package 100A, 100Aa or 100Ab may further include substrate bumps 61, interposer bumps 62, chip bumps 63, and underfills 71 and 72. The substrate bumps 61 may be disposed at a lower portion of the substrate 10. The interposer bumps 62 may be disposed between the substrate 10 and the interposer 20. The chip bumps 63 may be disposed between the interposer 20 and the logic chips 31 and 32 and between the interposer 20 and the memory stacks 41a to 41d and 42a to 42d. Each of the substrate bumps 61, the interposer bumps 62 and the chip bumps 63 may include a solder ball or metal. The stiffening chips 51a and 51b may have a hexahedral or solid shape. In some example embodiments, the stiffening chips 51a and 52a may each include a solid dummy chip and a plurality of stacked dummy chips. That is, each of the stiffening chips 51a and 51b may include a chip stack. The stiffening chips 51a and 51b may include a portion of a silicon wafer (a silicon die), a portion of a printed circuit board, a metal or ceramic die, an epoxy compound, a solidified polymer resin, an inorganic material such as glass, and/or other hard materials.

The substrate 10 may have a thickness of about 1.5 to 2 mm. In some example embodiments, the substrate 10 may have a thickness of about 1.722 mm. The interposer 20 may be thinner than the substrate 10, or, alternatively, the interposer 20 and the substrate 10 may have same thickness. For example, the interposer 20 may have a thickness of about 0.5 to 1.5 mm. In some example embodiments, the interposer 20 may have a thickness of about 0.11 mm. That is, the substrate 10 and the interposer 20 are very thin and, as such, may not provide much protection for electrical connections of the logic chips 31, the memory stacks 41a to 41d and 42a to 42d, the interposer 20 and the substrate 10 from physical stress such as warpage. The diameter or vertical height of the substrate bumps 61 may be about 0.2 to 0.8 mm. In some example embodiments, the diameter or vertical height of the substrate bumps 61 may be about 0.46 mm. The diameter or vertical height of the interposer bumps 62 may be about 0.05 to 0.1 mm smaller than that of the substrate bumps 61. In some example embodiments, the diameter or vertical height of the interposer bumps 62 may be about 0.07 mm. The diameter or vertical height of the chip bumps 63 may be about 0.02 to 0.05 mm. In some example embodiments, the diameter or vertical height of the chip bumps 63 may be about 0.0356 mm smaller than that of the interposer bumps 62. The total height of the semiconductor package 100A may be about 2.7 to 3.3 mm. In some example embodiments, the total height of the semiconductor package 100A may be 3.082 mm. The vertical height of the logic chips 31 and 32 may be about 0.65 to 0.72 mm. In some example embodiments, the vertical height of the logic chips 31 and 32 may be about 0.685 mm. Accordingly, the total vertical height of the interposer bumps 62, the interposer 20, the chip bumps 63 and the logic chips 31 and 32 may be about 0.8 to 1.0 mm. In some example embodiments, the total vertical height of the interposer bumps 62, the interposer 20, the chip bumps 63 and the logic chips 31 and 32 may be about 0.9 mm.

The semiconductor package 100A, 100Aa or 100Ab may include substrate bump pads 11 disposed at the lower portion of the substrate 10, and interposer bump pads 12 disposed at an upper portion of the substrate 10. The substrate bump pads 11 and the interposer bump pads 12 may be electrically connected through substrate wirings 15 and substrate vias 16. The substrate bump pads 11 may contact the substrate bumps 61, respectively, and, as such, may be electrically connected to an external circuit board. The interposer bump pads 12 may contact respective interposer bumps 62 and, as such, may be electrically connected to the interposer 20.

The interposer 20 may internally include an interposer wiring 25 and interposer vias. The interposer wiring 25 and the interposer vias 26 may include a conductor such as metal. The interposer wiring 25 and the interposer vias 26 may electrically connect the interposer bumps 62 and the chip bumps 63. The chip bumps 63 may electrically connect the interposer 20 and the logic chips 31 and 32 while electrically connecting the interposer 20 and the memory stacks 41a to 41d and 42a to 42d. For example, the upper and lower logic chips 31 and 32 may be electrically connected through the chip bumps 63, the interposer wiring 25 and the interposer vias 26, for dual processing thereof. The first to fourth upper memory chips 41a to 41d may be electrically connected to the upper logic chip 31 through the chip bumps 63, the interposer wiring 25 and the interposer vias 26. The first to fourth lower memory chips 42a to 42d may be electrically connected to the lower logic chip 32 through the chip bumps 63, the interposer wiring 25 and the interposer vias 26.

The underfills 71 and 72 may include an interposer underfill 71 and a chip underfill 72. The interposer underfill 71 may be formed between the substrate 10 and the interposer 20 to surround the interposer bumps 62. The interposer underfill 71 may provide bonding force between the substrate 10 and the interposer 20. The chip underfill 72 is formed between the interposer 20 and the logic chips 31 and 32 and between the interposer 20 and the memory stacks 41a to 41d and 42a to 42d to surround the chip bumps 63. The chip underfill 72 may provide bonding force between the interposer 20 and the logic chips 31 and 32 and between the interposer 20 and the memory stacks 41a to 41d and 42a to 42d. The underfills 71 and 72 may include a thermosetting resin.

The molding compound 80 may surround an upper surface of the substrate 10, side and upper surfaces of the interposer 20, side surfaces of the logic chips 31 and 32 and side surfaces of the memory stacks 41a to 41d and 42a to 42d. The molding compound 80 may be filled between the logic chips 31 and 32 and the memory stacks 41a to 41d and 42a to 42d. Upper surfaces of the logic chips 31 and 32 and the memory stacks 41a to 41d and 42a to 42d may be exposed without being covered by the molding compound 80. In some example embodiments, the upper surfaces of the logic chips 31 and 32 and the memory stacks 41a to 41d and 42a to 42d may be covered by the molding compound 80. The molding compound 80 may include an epoxy molding compound (EMC).

Referring to FIG. 1C, the interposer 20 and the stiffening chip 51a may be connected and fixed through an adhesive structure, for example, the chip bumps 63. The chip bumps 63 between the interposer 20 and the stiffening chip 51a may also be surrounded by the chip underfill 72. For example, when the stiffening chip 51a includes an under bumped metal (UBM), a metal pad or the like, the stiffening chip 51a, the chip bumps 63 and the interposer 20 may have physical bonding force. As described above, the chip underfill 72 may reinforce bonding force between the interposer 20 and the stiffening chip 51a.

Referring to FIG. 1D, the interposer 20 and the stiffening chip 51a may be connected and fixed through an adhesive structure, for example, an adhesive layer 75. The adhesive layer 75 may include a curable resin having an adhesive property such as a die attach film (DAF) or a non-conductive film (NCF). When the stiffening chip 51a does not include a UBM or a metal pad, the interposer 20 and the stiffening chip 51a may be physically bonded and fixed by the adhesive layer 75. In some example embodiments, when the stiffening chip 51a includes a dummy chip, no electrical connection may be formed between the interposer 20 and the stiffening chip 51a.

Figure 1E:
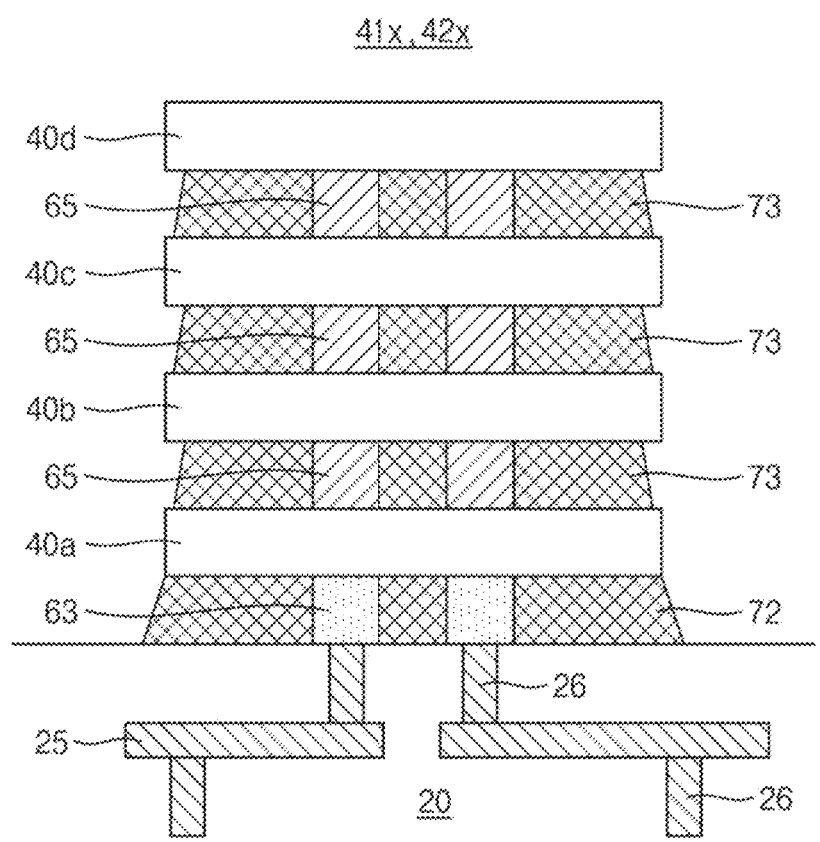
FIG. 1E is an enlarged side view of the memory stacks.

FIG. 1E is an enlarged side view of the memory stacks 41a to 41d and 42a to 42d. Referring to FIG. 1E, each of memory stacks 41x and 42x may include a plurality of stacked memory chips 40a to 40d, through vias 65, and adhesive films 73. The memory chips 40a to 40d in each of the memory stacks 41a to 41d and 42a to 42d may include non-volatile memory chips such as dynamic random access memory (DRAM), resistive random access memory (RRAM), magneto-resistive random access memory (MRAM), phase-changeable random access memory (PRAM) and/or flash memory or other various memory chips. In some example embodiments, the memory chip of the lowermost layer, that is, the memory chip 40a, may include a base die. The base die may include a test logic circuit such as design for test (DFT), joint test action group (JTAG), or memory built-in self-test (MBIST), a signal interface circuit such as PHY, or the like.

When the lowermost memory chip 40a is a base die, the number of stacked memory chips may be 4 or more. In FIG. 1E, only three memory chips 40x are shown, although the inventive concepts are not limited thereto. The through vias 65 may be connected to corresponding ones of the chip bumps 63 while extending vertically through the memory chips 40a to 40d. The through vias 65 may be vertically aligned with corresponding ones of the chip bumps 63. Each adhesive film 73 may be interposed between adjacent ones of the stacked memory chips 40a to 40d. Each adhesive film 73 may include a die attach film (DAF). In some example embodiments, each adhesive film 73 may include an underfill material.

Figure 2A:
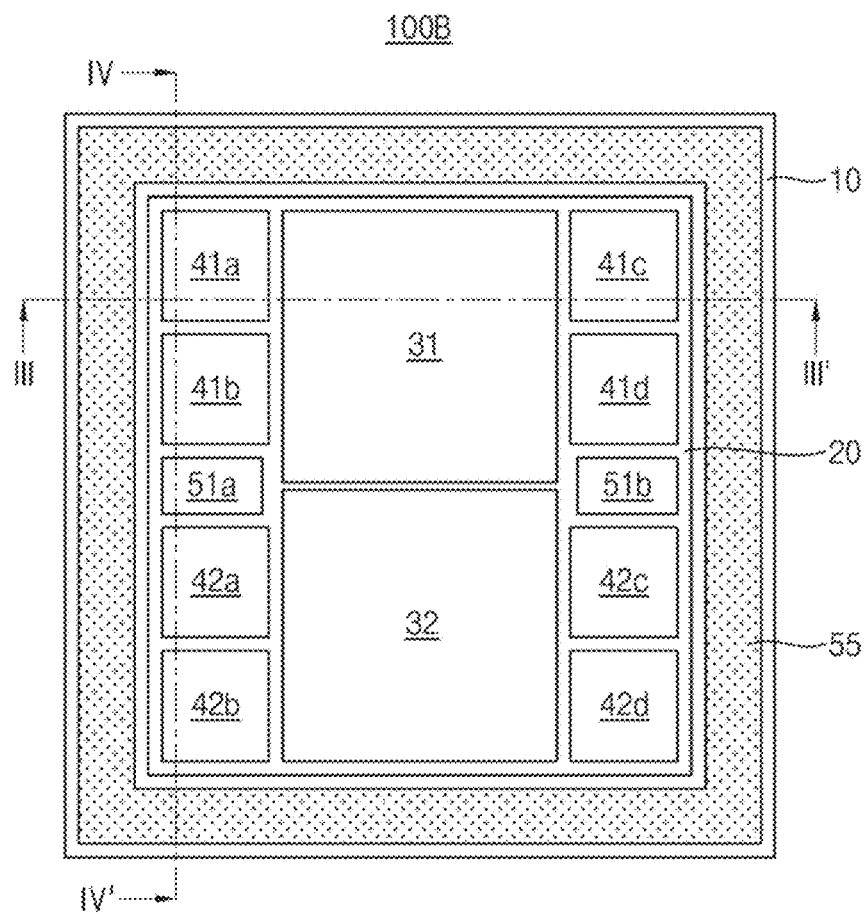
FIG. 2A is a projected top view schematically showing a semiconductor package according to some example embodiments of the disclosure.
Figure 2B:
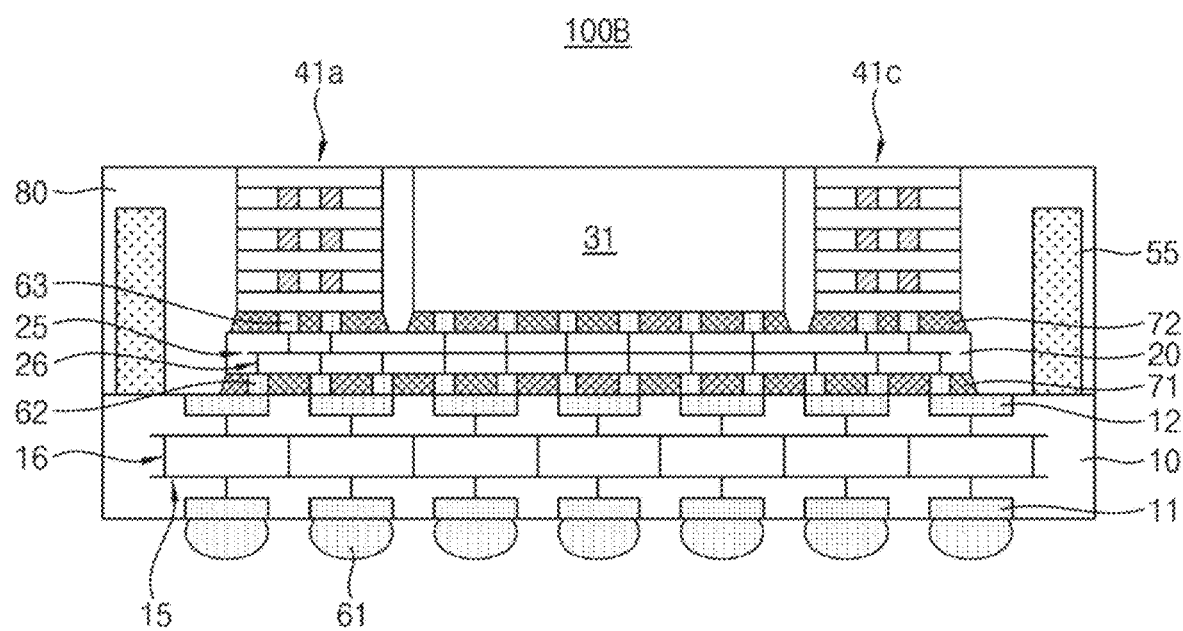
FIG. 2B is a cross-sectional view or a projected side view of the semiconductor package shown in FIG. 2A, taken along line in FIG. 2A.
Figure 2C:
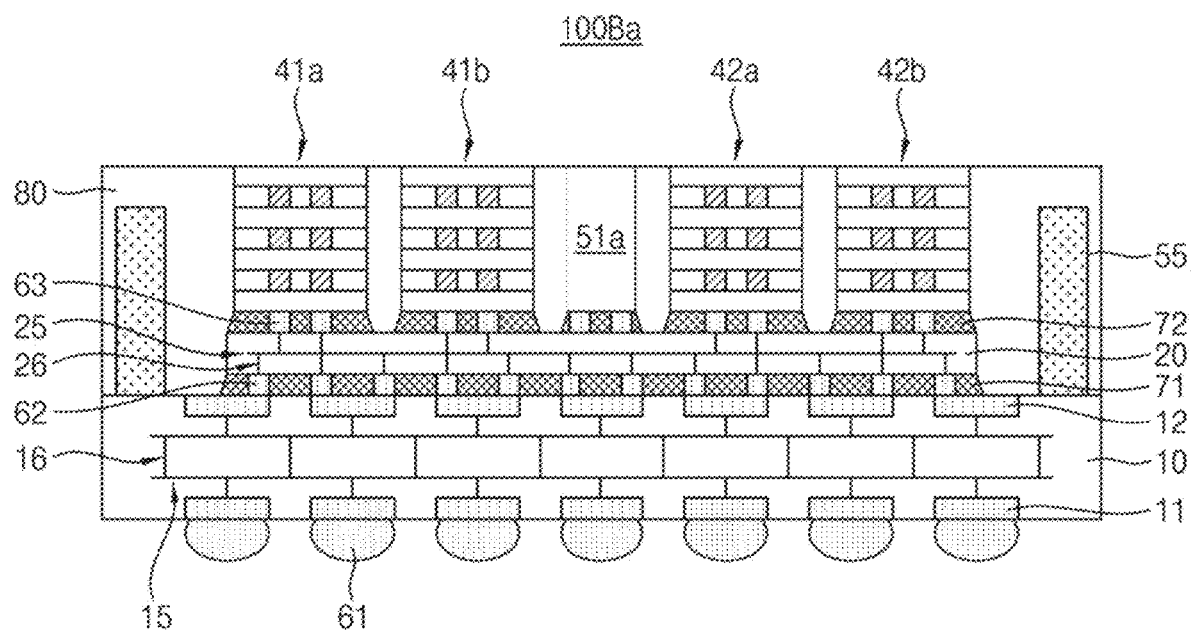
FIGS. 2C and 2D are cross-sectional views or projected side views of the semiconductor package shown in FIG. 2A, taken along line IV-IV' in FIG. 2A.
Figure 2D:
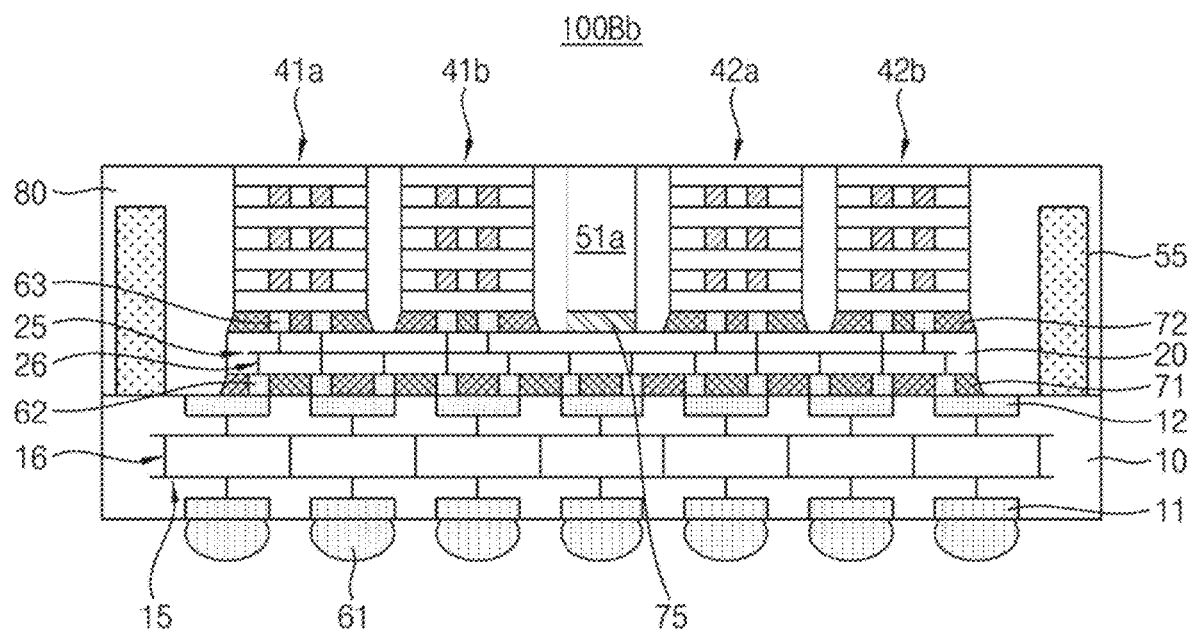

FIG. 2A is a projected top view schematically showing a semiconductor package 100B according to some example embodiments of the disclosure. FIG. 2B is a cross-sectional view or a projected side view of the semiconductor package 100B shown in FIG. 2A, taken along line in FIG. 2A. FIGS. 2C and 2D are cross-sectional views or projected side views of the semiconductor package 100B shown in FIG. 2A, taken along line IV-IV' in FIG. 2A.

Referring to FIGS. 2A to 2D, the semiconductor package 100B according to some example embodiments of the disclosure may include an interposer 20 disposed on a substrate 10, logic chips 31 and 32, memory stacks 41a to 41d and 42a to 42d, and a stiffening dam 55. The substrate 10, the interposer 20, the logic chips 31 and 32, and the memory stacks 41a to 41d and 42a to 42d have been described with reference to FIGS. 1A to 1E and, as such, no additional description thereof will be given. The stiffening dam 55 may be disposed on the interposer 20 in the form of a frame, although the stiffening dam 55 may be in another form, for example having a rounded cross-section. The stiffening dam 55 may include a portion of a silicon wafer, a portion of a printed circuit board, a metal or ceramic bar, an epoxy compound, a solidified polymer resin, an inorganic material such as glass, or other hard materials.

An upper end of the stiffening dam 55 may be lower than upper ends of the logic chips 31 and 32 and upper ends of the memory stacks 41a to 41d and 42a to 42d such that a molding compound 80 may uniformly fill an inside of the stiffening dam 55 and an outside of the stiffening dam 55. The stiffening dam 55 may be bonded and fixed to an upper surface of the interposer 20 by an adhesive material. The stiffening dam 55 may have a vertical height of about 0.64 to 0.75 mm. In some example embodiments, the vertical height of the stiffening dam 55 including the adhesive material may be about 0.71 mm. The vertical height (thickness) of the adhesive material may be about 0.08 to 0.12 mm. In some example embodiments, the vertical height (thickness) of the adhesive material may be about 0.1 mm. Referring to FIG. 2C, a stiffening chip 51a may be connected and fixed to the interposer 20 through chip bumps 63 and a chip underfill 72. Referring to FIG. 2D, the stiffening chip 51a may be bonded and fixed to the interposer 20 through an adhesive layer 75.

FIGS. 2E to 2H are projected top views schematically showing semiconductor packages 100Bc to 100Bf according to respective example embodiments of the disclosure. No description will be given of overlapping constituent elements.

Figure 2E:
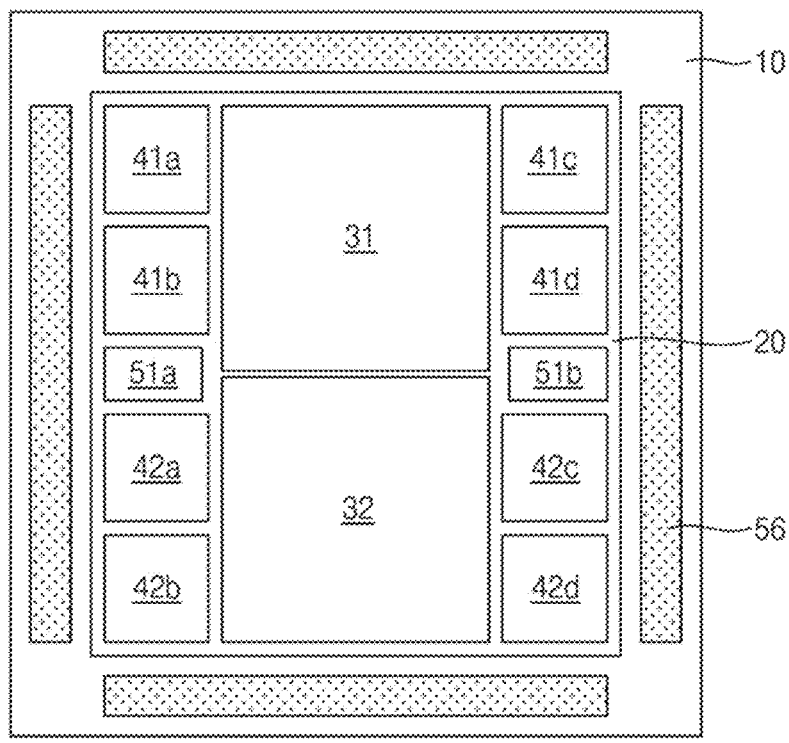
FIGS. 2E to 2H are projected top views schematically showing semiconductor packages according to various example embodiments of the disclosure, respectively.

Referring to FIG. 2E, the semiconductor package 100Bc according to some example embodiments of the disclosure may include stiffening dams 56 surrounding upper, lower and opposite lateral sides of logic chips 31 and 32, and memory stacks 41a to 41d and 42a to 42d. Each stiffening dam 56 may have a bar shape, although other shapes may be used, for example a crescent shape. For example, no stiffening dam 56 may be disposed at corners of the interposer 20.

Figure 2F:
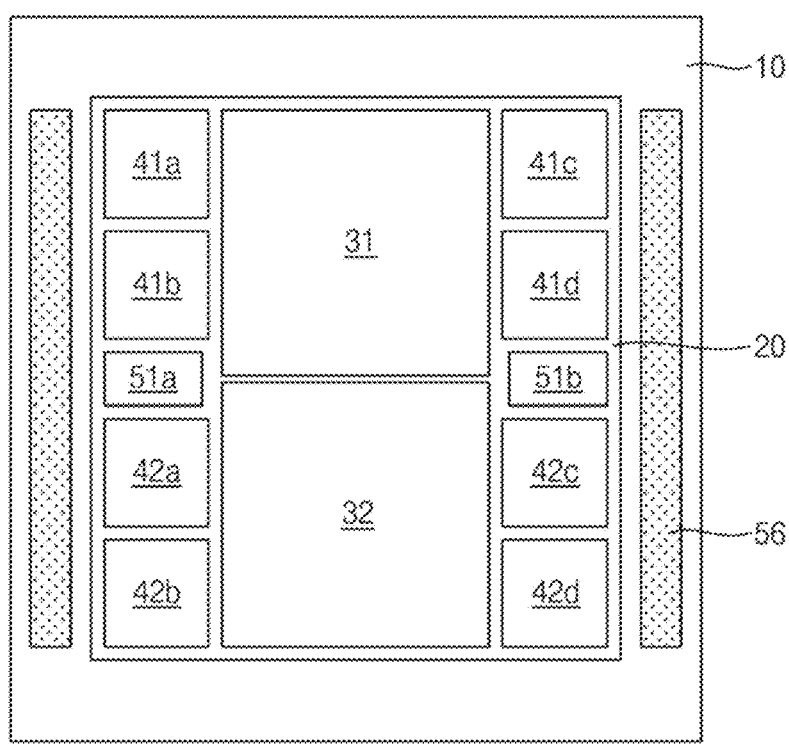

Referring to FIG. 2F, the semiconductor package 100Bd according to some example embodiments of the disclosure may include stiffening dams 56 surrounding opposite lateral sides of logic chips 31 and 32, and memory stacks 41a to 41d and 42a to 42d while having a bar shape. For example, the stiffening dams 56 disposed at upper and lower sides in FIG. 2E may be omitted.

Figure 2G:
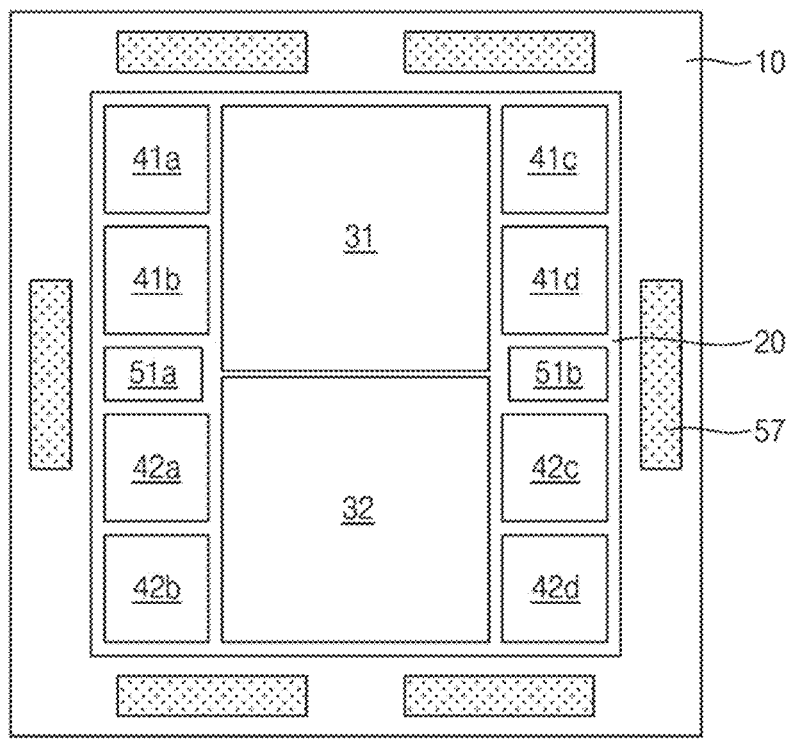

Referring to FIG. 2G, the semiconductor package 100Be according to some example embodiments of the disclosure may include a plurality of stiffening dams 57 each having the form of a segment. The segment type stiffening dams 57 may be disposed such that a part of the stiffening dams 57 are aligned and overlap with an extension line of a boundary area (boundary line) between the logic chips 31 and 32 in a row direction, and the remaining part of the stiffening dams 57 are aligned and overlap with extension lines of boundary areas (boundary lines) between the logic chips 31 and 32 and the memory stacks 41a to 41d and 42a to 42d in a column direction, respectively.

Figure 2H:
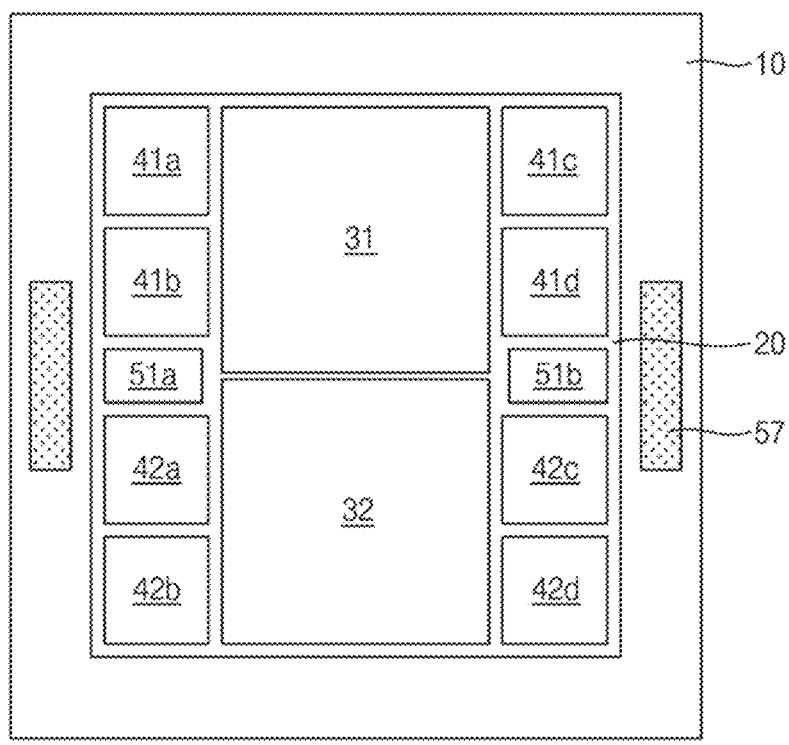

Referring to FIG. 2H, the semiconductor package 100Bf according to some example embodiments of the disclosure may include segment type stiffening dams 57 aligned and overlapping with an extension line of a boundary area (boundary line) between the logic chips 31 and 32 in a row direction. For example, as compared to the case of FIG. 2G, the stiffening dams 57, which are aligned and overlap with the extension lines of the boundary areas (boundary lines) between the logic chips 31 and 32 and the memory stacks 41a to 41d and 42a to 42d in the column direction, respectively, may be omitted.

Figure 3A:
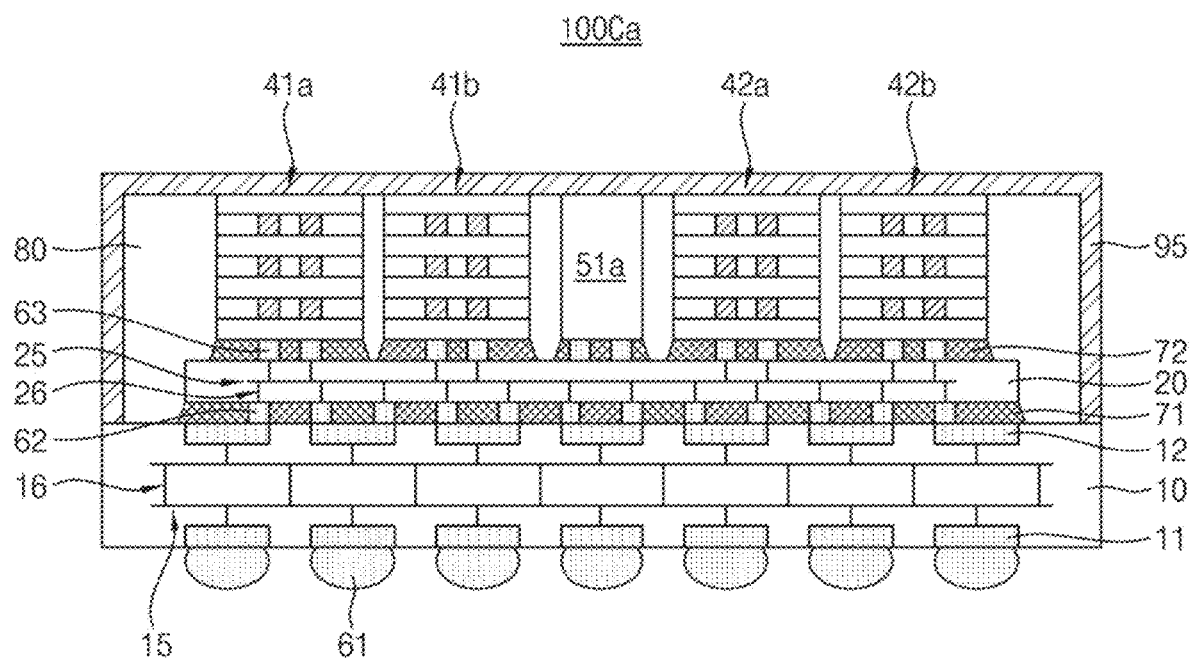
FIGS. 3A and 3B are cross-sectional views schematically showing semiconductor packages according to example embodiments of the disclosure, respectively.
Figure 3B:
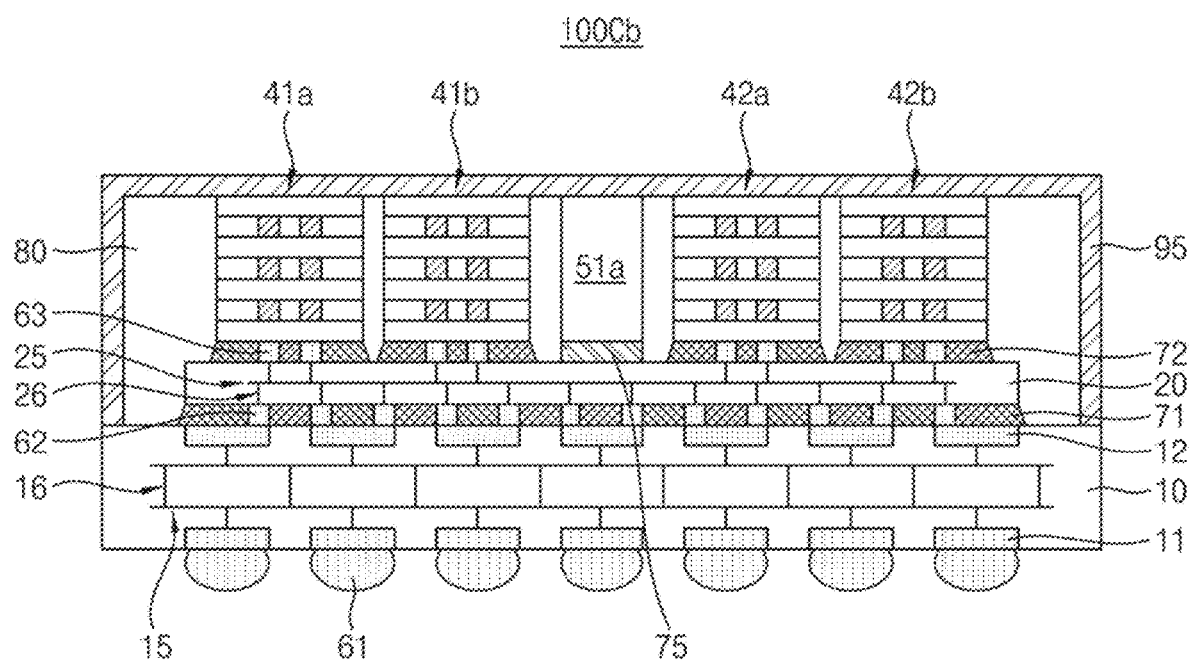

FIGS. 3A and 3B are cross-sectional views schematically showing semiconductor packages 100Ca and 100Cb according to example embodiments of the disclosure, respectively.

Referring to FIGS. 1A, 3A and 3B, each of the semiconductor packages 100Ca and 100Cb according to some example embodiments of the disclosure may include an interposer 20 disposed on a substrate 10, logic chips 31 and 32, memory stacks 41a to 41d and 42a to 42d, stiffening chips 51a and 51b, a molding compound 80, and a stiffening cover 95. The stiffening cover 95 may cover the interposer 20, the logic chips 31 and 32, the memory stacks 41a to 41d and 42a to 42d, the stiffening chips 51a and 51b, and the molding compound 80. The stiffening cover 95 may completely cover upper surfaces of the logic chips 31 and 32, the memory stacks 41a to 41d and 42a to 42d, the stiffening chips 51a and 51b, and the molding compound 80, and side surfaces of the molding compound 80. Referring to FIG. 3A, the stiffening chip 51a may be connected and fixed to the interposer 20 through chip bumps 63 and a chip underfill 72. Referring to FIG. 3B, the stiffening chip 51a may be bonded and fixed to the interposer 20 through an adhesive layer 75.

Figure 4A:
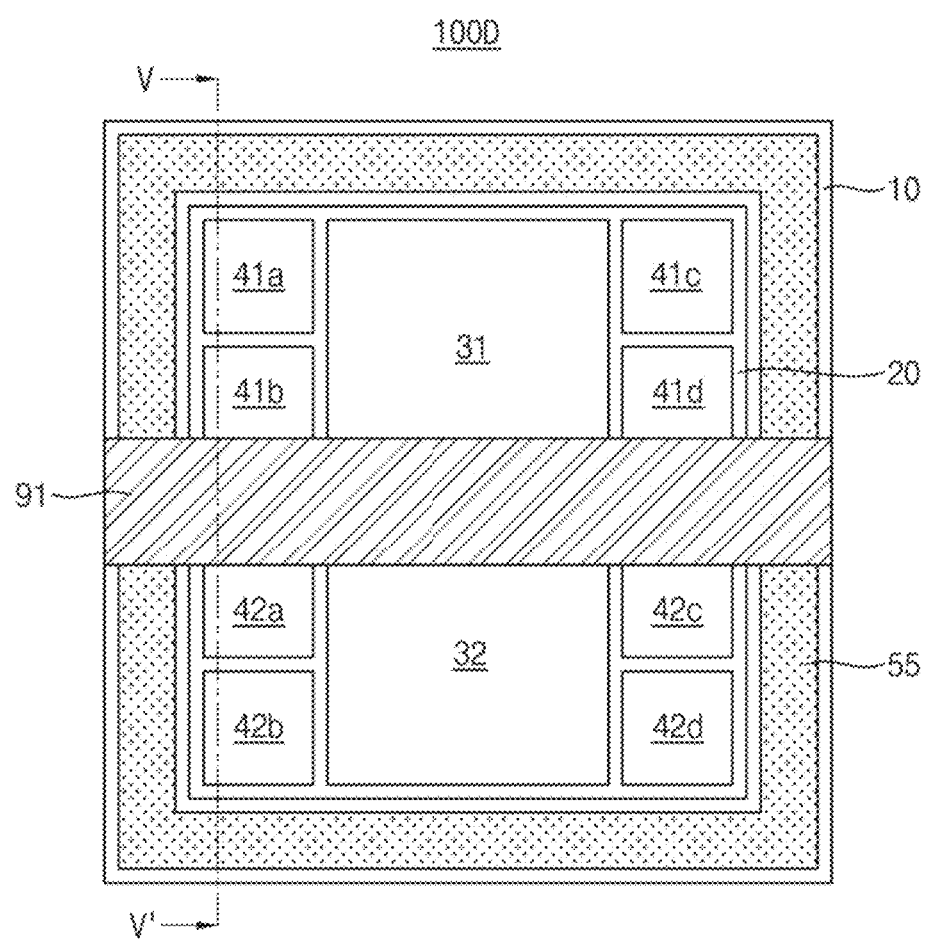
FIG. 4A is a projected top view or a projected layout view of a semiconductor package according to some example embodiments of the disclosure.
Figure 4B:
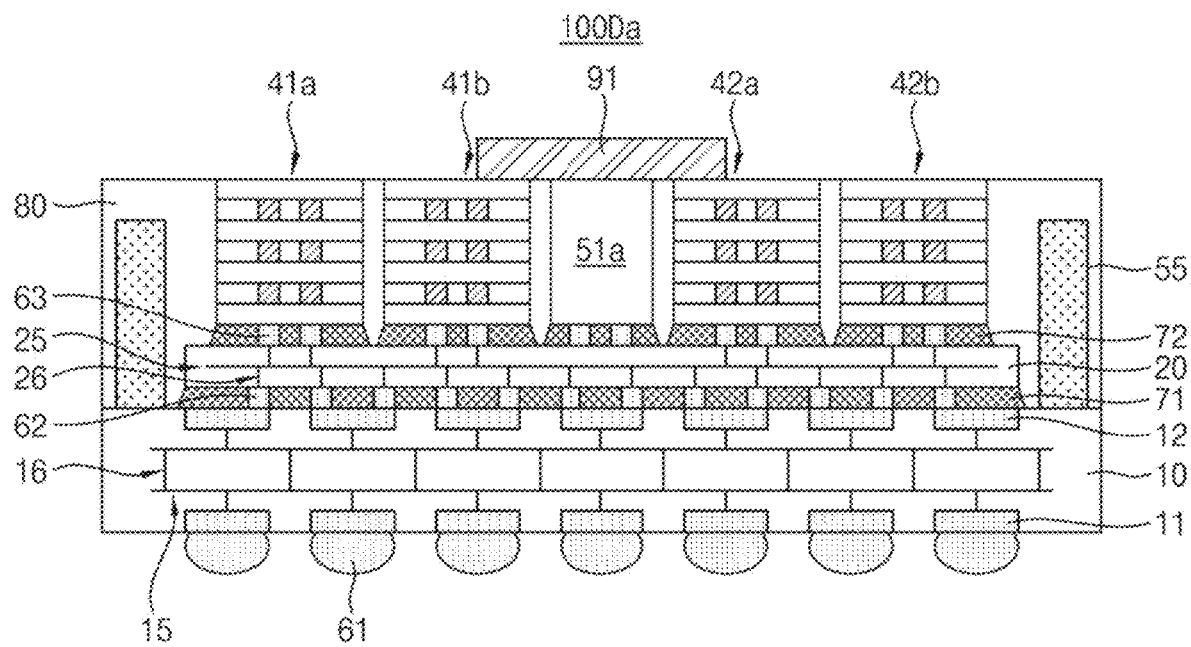
FIGS. 4B and 4C are cross-sectional views or projected side views of the semiconductor package shown in FIG. 4A, taken along line V-V' in FIG. 4A.
Figure 4C:
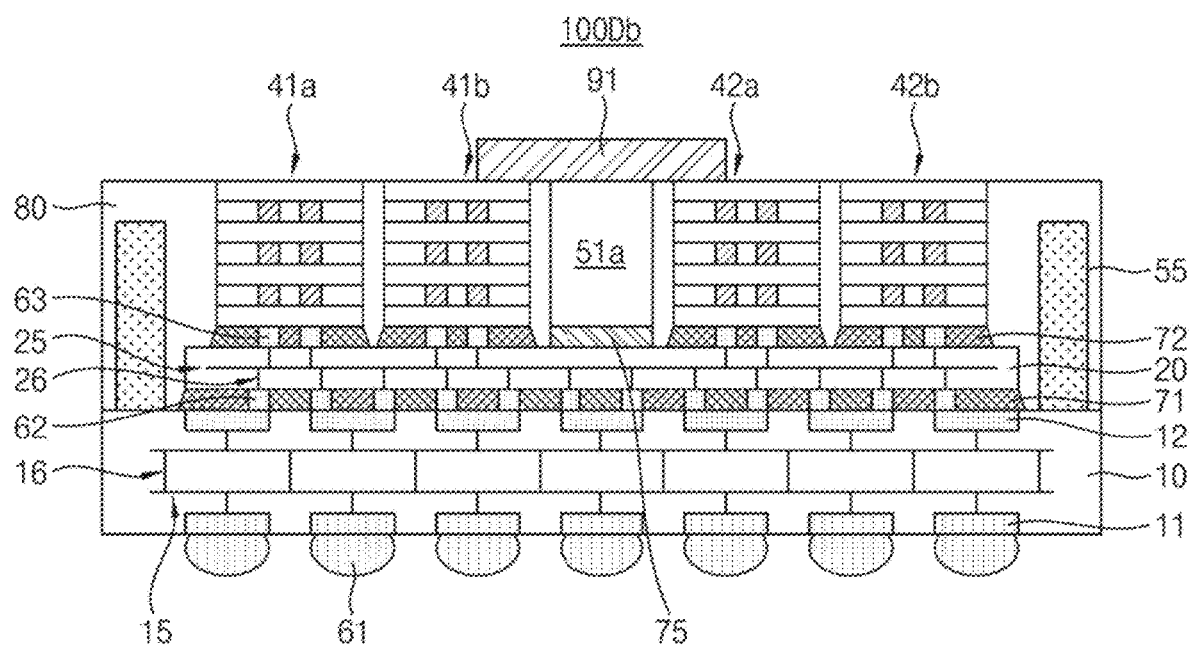

FIG. 4A is a projected top view or a projected layout view of a semiconductor package 100D according to some example embodiments of the disclosure. FIGS. 4B and 4C are cross-sectional views or projected side views of the semiconductor package 100D shown in FIG. 4A, taken along line V-V' in FIG. 4A.

Referring to FIGS. 4A to 4C, the semiconductor package 100D, 100Da or 100Db according to some example embodiments of the disclosure may include an interposer 20 disposed on a substrate 10, logic chips 31 and 32, memory stacks 41a to 41d and 42a to 42d, and stiffening structures 51a, 55, and 91. The stiffening structures 51a, 55, and 91 may include a stiffening chip 51a, a stiffening dam 55, and a stiffening plate 91. The stiffening plate 91 may be disposed on the logic chips 31 and 32. The stiffening plate 91 may have the form of a bar or segments extending to be vertically aligned or overlap with a boundary area (boundary line) between the logic chips 31 and 32. The stiffening plate 91 may include a material which is hard while exhibiting excellent thermal conductivity, such as metal. Accordingly, the stiffening plate 91 may additionally perform a heat dissipation function. In some example embodiments, an upper surface of the stiffening plate 91 may have a heat sink structure (e.g., grooves and protrusions).

Referring to FIG. 4B, the stiffening chip 51a may be connected and fixed to the interposer 20 through an adhesive structure such as chip bumps 63. Referring to FIG. 4C, the stiffening chip 51a may be bonded and fixed to the interposer 20 through an adhesive structure such as an adhesive layer 75. Constituent elements not described may be understood by referring to other drawings.

Figure 5A:
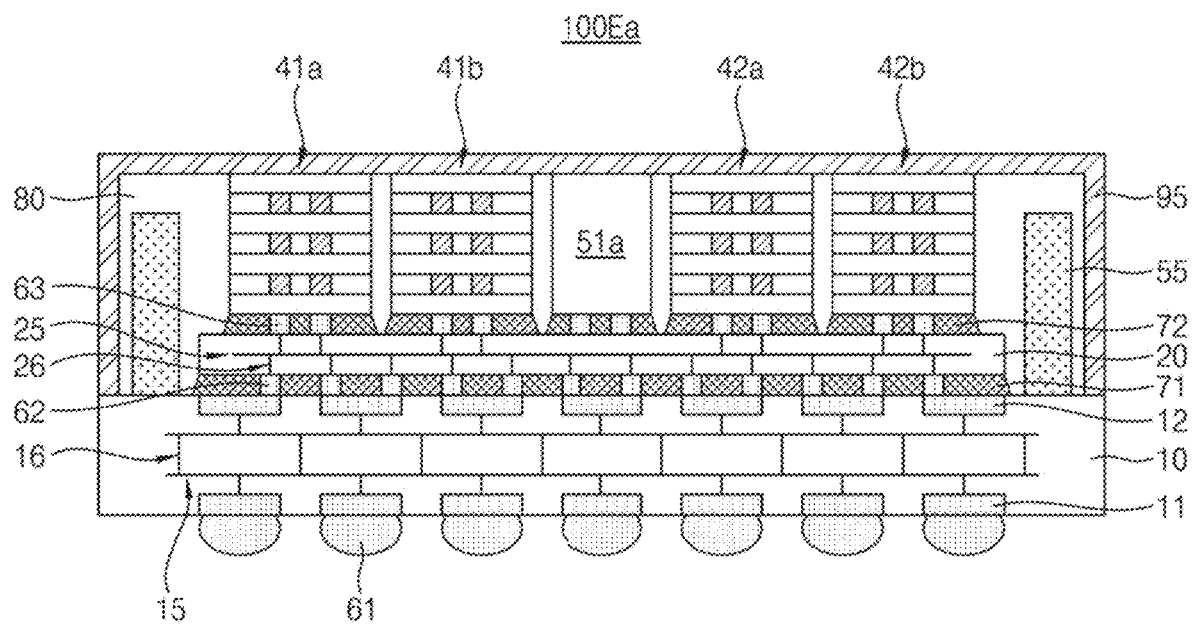
FIGS. 5A and 5B are cross-sectional views schematically showing semiconductor packages and according to example embodiments of the disclosure, respectively.
Figure 5B:
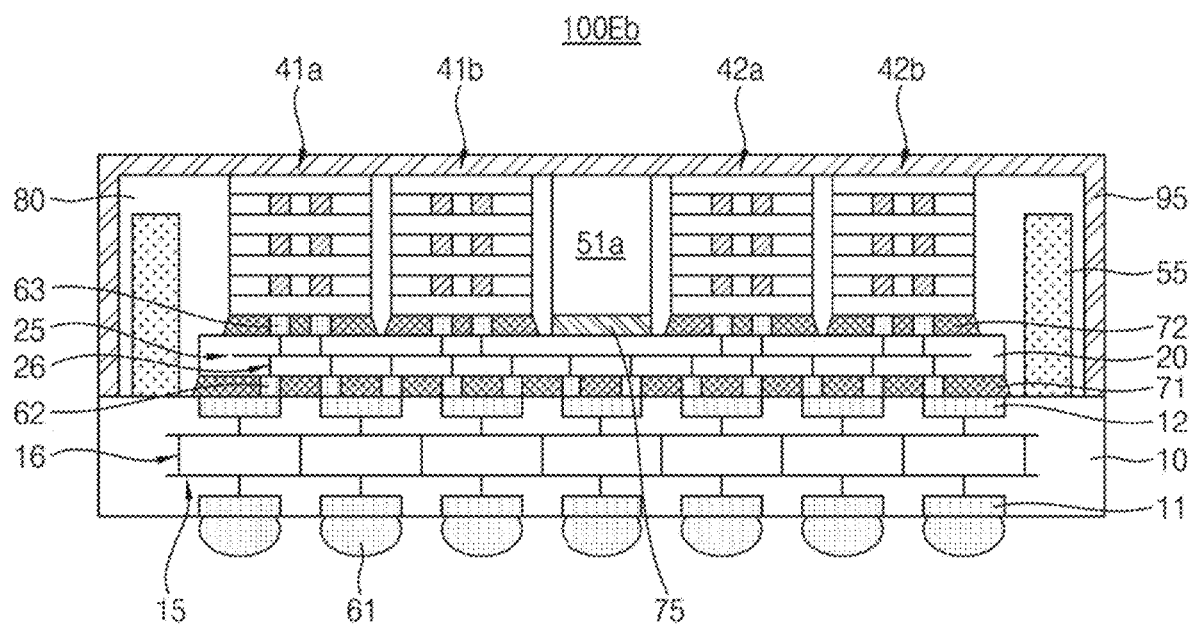

FIGS. 5A and 5B are cross-sectional views schematically showing semiconductor packages 100Ea and 100Eb according to example embodiments of the disclosure, respectively. Referring to FIGS. 5A and 5B, each of the semiconductor packages 100Ea and 100Eb according to some example embodiments of the disclosure may include an interposer 20 disposed on a substrate 10, logic chips 31 and 32, memory stacks 41a to 41d and 42a to 42d, a stiffening chip 51a, a stiffening dam 55, a molding compound 80, and a stiffening cover 95. The stiffening cover 95 may cover the interposer 20, the logic chips 31 and 32, the memory stacks 41a to 41d and 42a to 42d, the stiffening chip 51a, and the molding compound 80. The stiffening cover 95 may completely cover upper and side surfaces of the logic chips 31 and 32, the memory stacks 41a to 41d and 42a to 42d, the stiffening dam 55, and the molding compound 80. Referring to FIG. 5A, the stiffening chip 51a may be connected and fixed to the interposer 20 through chip bumps 63. Referring to FIG. 5B, the stiffening chip 51a may be bonded and fixed to the interposer 20 through an adhesive layer 75. In some example embodiments, the stiffening dam 55 may be omitted.

FIGS. 6A to 6F are projected top views of semiconductor packages 100Fa to 100Ff according to example embodiments of the disclosure, respectively.

Figure 6A:
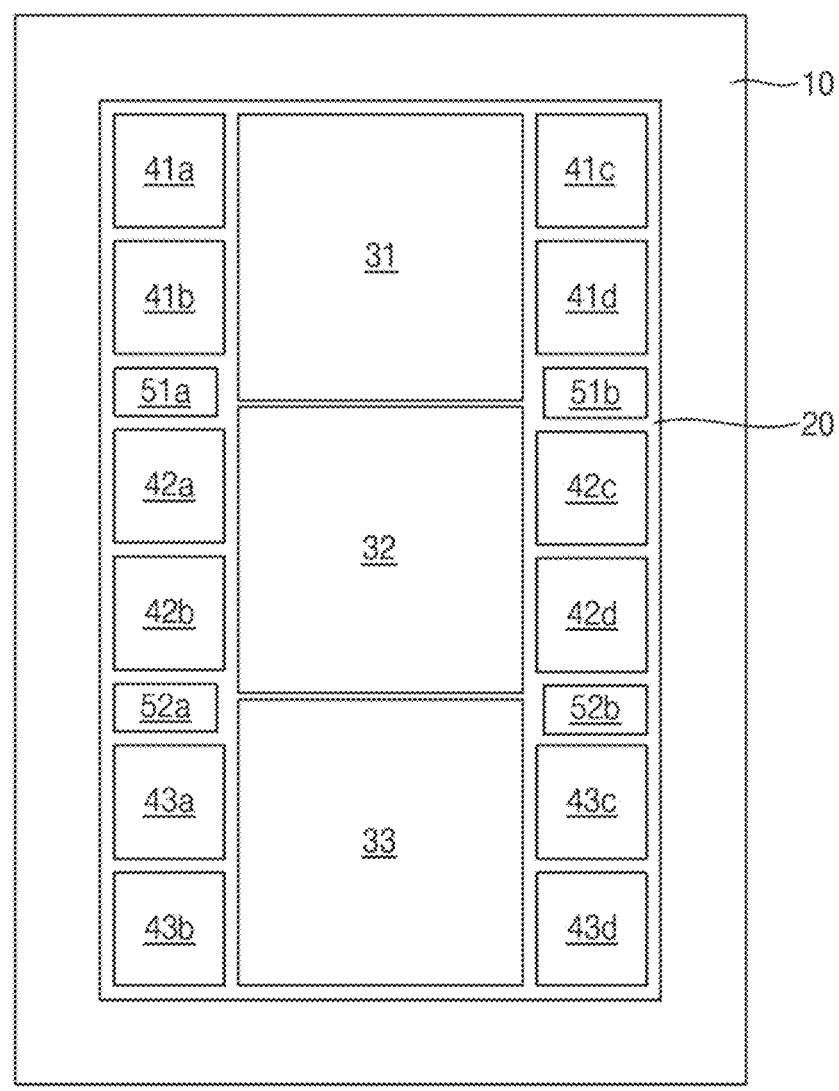
FIGS. 6A to 6F are projected top views of semiconductor packages according to example embodiments of the disclosure, respectively.

Referring to FIG. 6A, the semiconductor package 100Fa according to one example embodiments of the disclosure may include an interposer 20 disposed on a substrate 10, a plurality of logic chips 31 to 33, memory stacks 41a to 41d, 42a to 42d and 43a to 43d, and stiffening chips 51a, 51b, 52a and 52b. The logic chips 31 to 33 may be disposed side-by-side to be aligned in a column direction. The memory stacks 41a to 41d, 42a to 42d and 43a to 43d may be disposed in a row direction such that each group of the memory stacks 41a to 41d, 42a to 42d and 43a to 43d is disposed adjacent to two side surfaces of a corresponding one of the logic chips 31 to 33. For example, the memory stacks 41a to 41d, 42a to 42d and 43a to 43d may include first and second upper memory stacks 41a and 41b disposed adjacent to a first side surface of the upper logic chip 31, third and fourth upper memory stacks 41c and 41d disposed adjacent to a second side surface of the upper logic chip 31, first and second intermediate memory stacks 42a and 42b disposed adjacent to a first side surface of the intermediate logic chip 32, third and fourth intermediate memory stacks 42c and 42d disposed adjacent to a second side surface of the intermediate logic chip 32, first and second lower memory stacks 43a and 43b disposed adjacent to a first side surface of the lower logic chip 33, and third and fourth lower memory stacks 43c and 43d disposed adjacent to a second side surface of the lower logic chip 33.

Figure 6B:
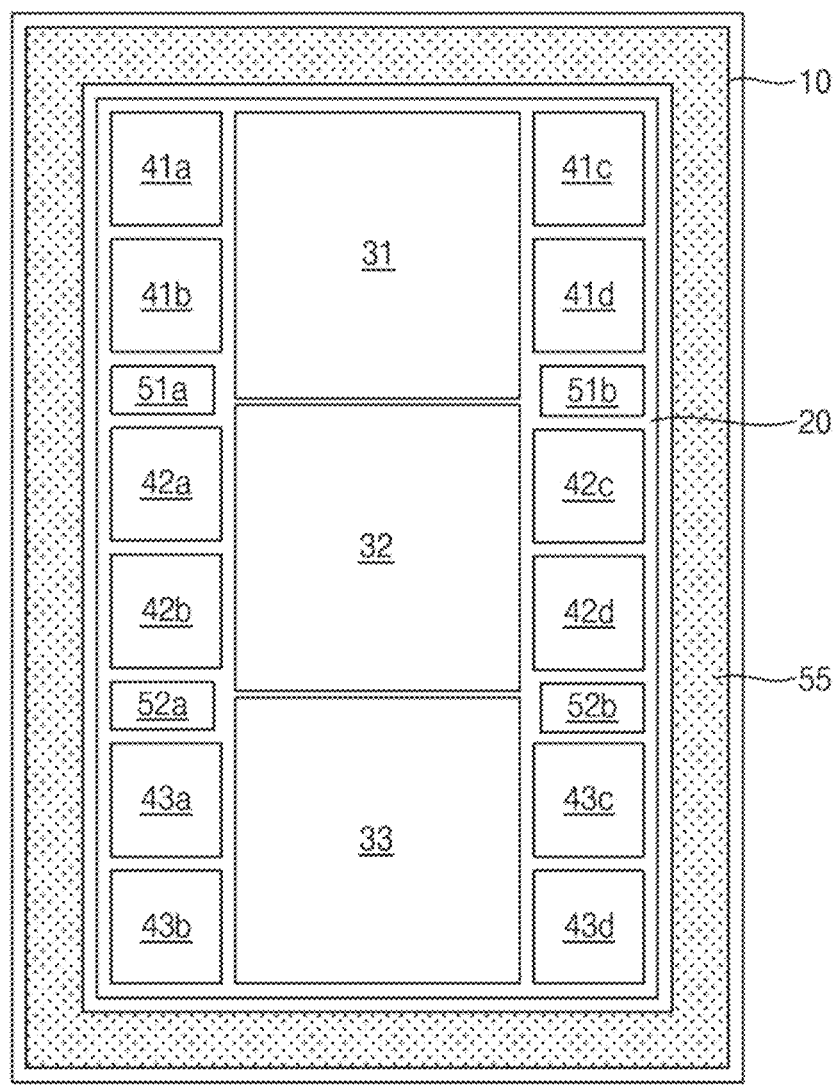

A first upper stiffening chip 51a may be disposed between the second upper memory stack 41b and the first intermediate memory stack 42a. A second upper stiffening chip 51b may be disposed between the fourth upper memory stack 41d and the third intermediate memory stack 42c. A first upper stiffening chip 52a may be disposed between the second intermediate memory stack 42b and the first lower memory stack 43a. A second lower stiffening chip 52b may be disposed between the fourth intermediate memory stack 42d and the third lower memory stack 43c. The first and second upper memory stacks 41a and 41b, the first upper stiffening chip 51a, the first and second intermediate memory stacks 42a and 42b, the first lower stiffening chip 52a, and the first and second lower memory stacks 43a and 43b may be aligned in the column direction. The third and fourth upper memory stacks 41c and 41d, the second upper stiffening chip 51b, the third and fourth intermediate memory stacks 42c and 42d, the second lower stiffening chip 52b, and the third and fourth lower memory stacks 43c and 43d may be aligned in the column direction. Referring to FIG. 6B, the semiconductor package 100Fb according to some example embodiments of the disclosure may further include a stiffening dam 55.

Figure 6C:
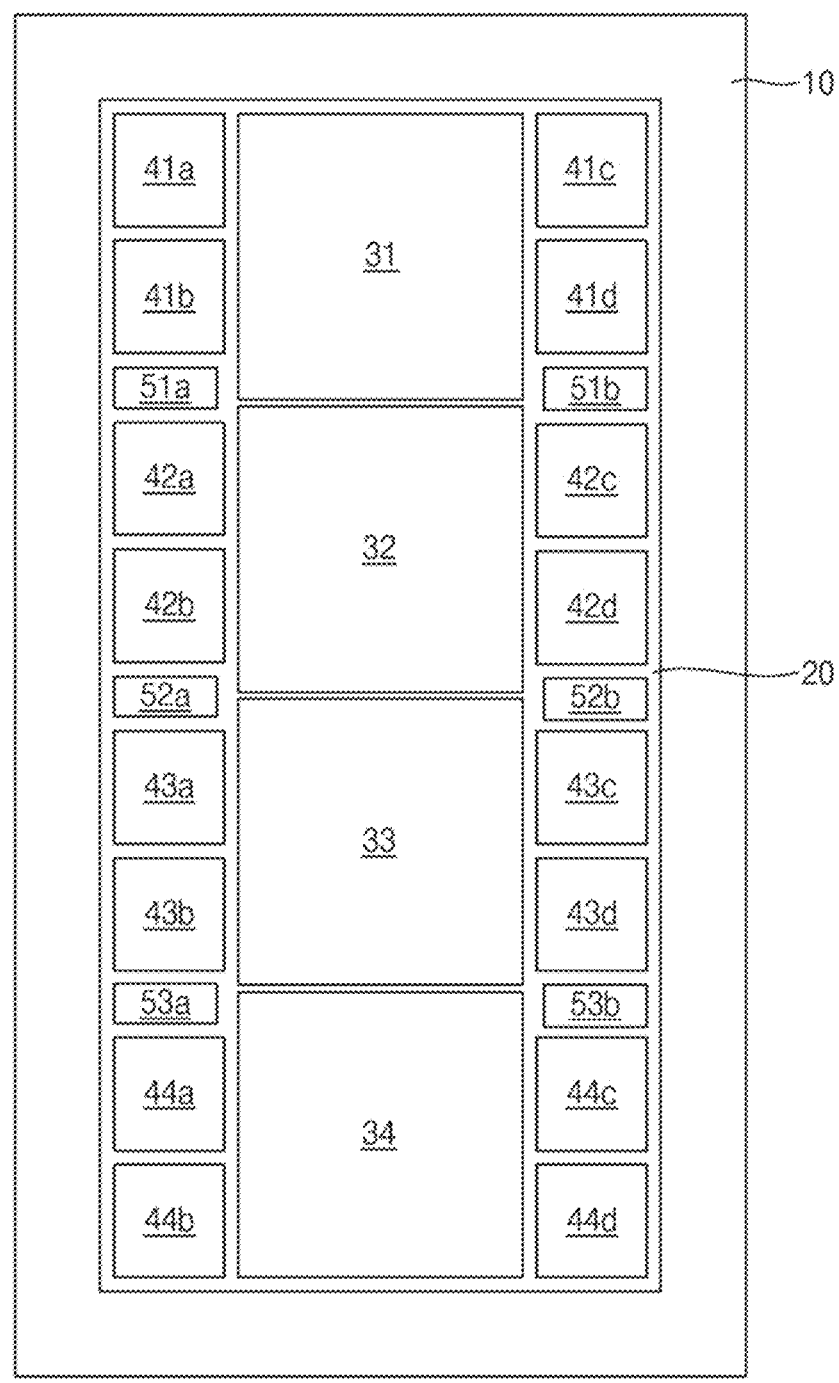

Referring to FIG. 6C, the semiconductor package 100Fc according to some example embodiments of the disclosure may include an interposer 20 disposed on a substrate 10, a plurality of logic chips 31 to 34, memory stacks 41a to 41d, 42a to 42d, 43a to 43d and 44a to 44d, and stiffening chips 51a, 51b, 52a, 52b, 53a and 53b. The logic chips 31 to 34 may be disposed side-by-side to be aligned in a column direction. Each group of the memory stacks 41a to 41d, 42a to 42d, 43a to 43d and 44a to 44d may be disposed at opposite side surfaces of a corresponding one of the logic chips 31 to 34 in a separated state. For example, the memory stacks 41a to 41d, 42a to 42d, 43a to 43d and 44a to 44d may include first and second upper memory stacks 41a and 41b disposed adjacent to a first side surface of the upper logic chip 31, third and fourth upper memory stacks 41c and 41d disposed adjacent to a second side surface of the upper logic chip 31, first and second intermediate upper memory stacks 42a and 42b disposed adjacent to a first side surface of the intermediate upper logic chip 32, third and fourth intermediate upper memory stacks 42c and 42d disposed adjacent to a second side surface of the intermediate upper logic chip 32, first and second intermediate lower memory stacks 43a and 43b disposed adjacent to a first side surface of the intermediate lower logic chip 33, third and fourth intermediate lower memory stacks 43c and 43d disposed adjacent to a second side surface of the intermediate lower logic chip 33, first and second lower memory stacks 44a and 44b disposed adjacent to a first side surface of the lower logic chip 34, and third and fourth lower memory stacks 44c and 44d disposed adjacent to a second side surface of the lower logic chip 34.

Figure 6D:
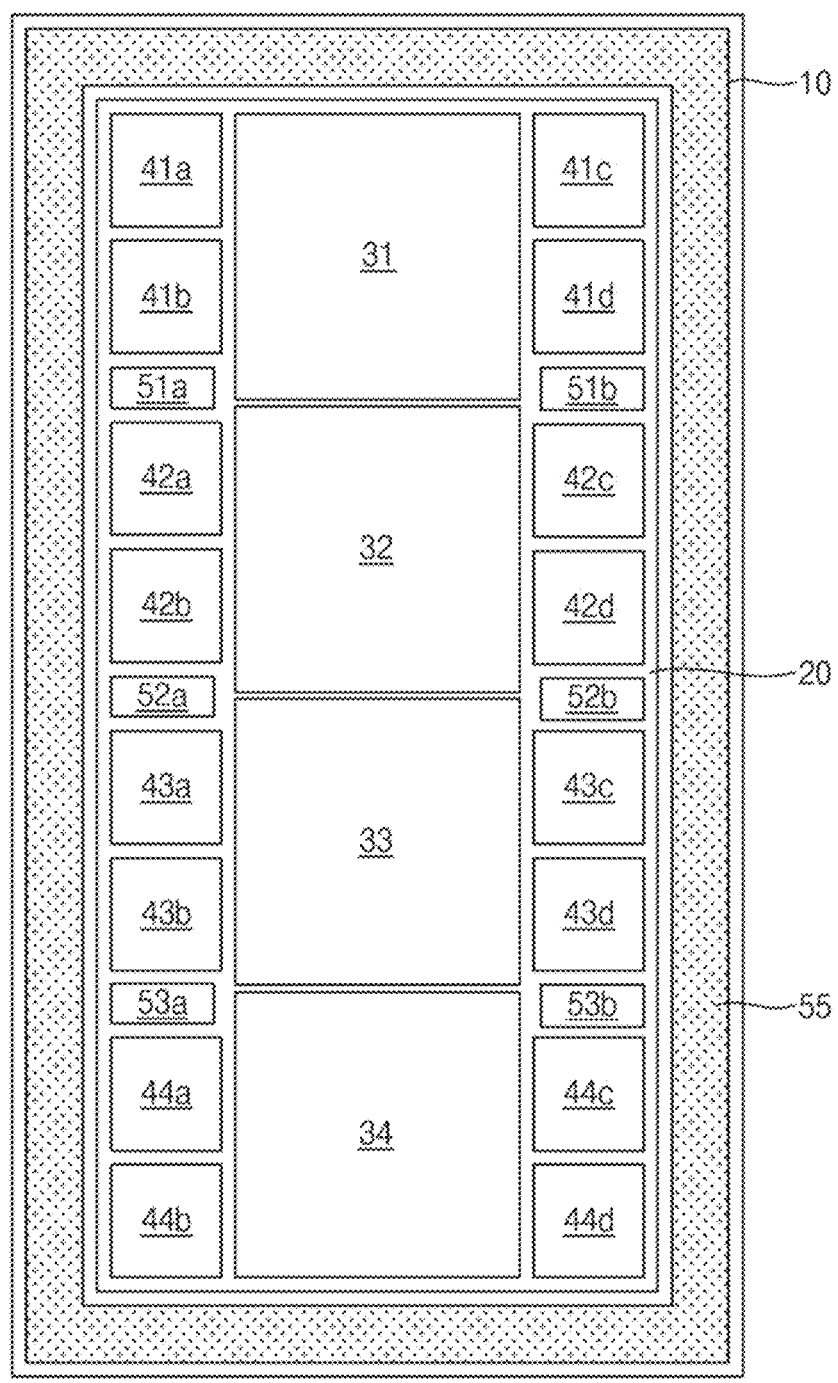

A first upper stiffening chip 51a may be disposed between the second upper memory stack 41b and the first intermediate upper memory stack 42a. A second upper stiffening chip 51b may be disposed between the fourth upper memory stack 41d and the third intermediate upper memory stack 42c. A first intermediate stiffening chip 52a may be disposed between the second intermediate upper memory stack 42b and the first intermediate lower memory stack 43a. A second intermediate stiffening chip 52b may be disposed between the fourth intermediate upper memory stack 42d and the third intermediate lower memory stack 43c. A first lower stiffening chip 53a may be disposed between the second intermediate lower memory stack 43b and the first lower memory stack 44a. A second lower stiffening chip 53b may be disposed between the fourth intermediate lower memory stack 43d and the third lower memory stack 44c. The first and second upper memory stacks 41a and 41b, the first upper stiffening chip 51a, the first and second intermediate upper memory stacks 42a and 42b, the first intermediate stiffening chip 52a, the first and second intermediate lower memory stacks 43a and 43b, the first lower stiffening chip 53a, and the first and second lower memory stacks 44a and 44b may be aligned in the column direction. The third and fourth upper memory stacks 41c and 41d, the second upper stiffening chip 51b, the third and fourth intermediate upper memory stacks 42c and 42d, the second intermediate stiffening chip 52b, the third and fourth intermediate lower memory stacks 43c and 43d, the second lower stiffening chip 52b, and the third and fourth lower memory stacks 44a and 44b may be aligned in the column direction. Referring to FIG. 6D, the semiconductor package 100Fd according to some example embodiments of the disclosure may further include a stiffening dam 55.

Figure 6E:
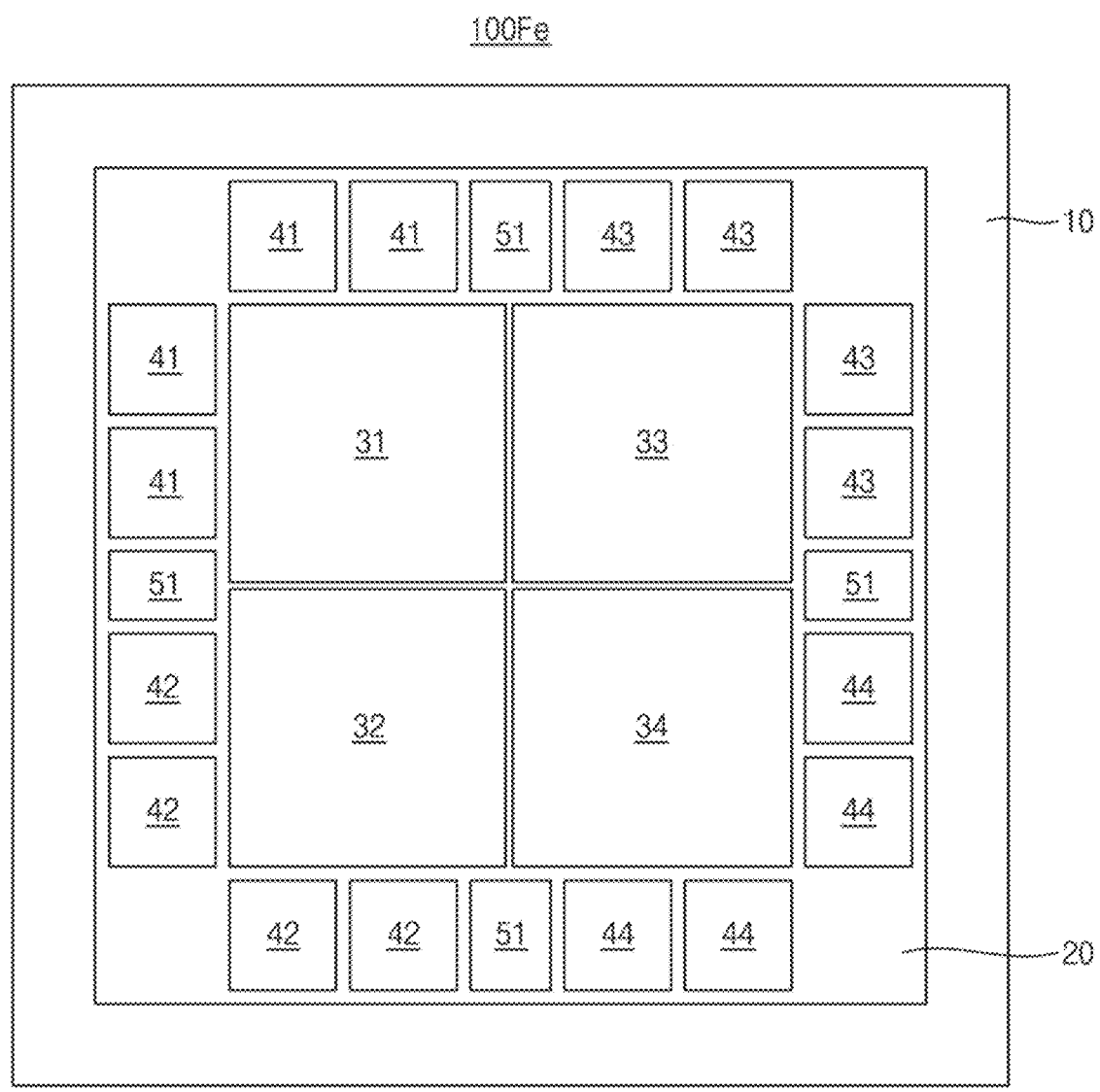
Figure 6F:
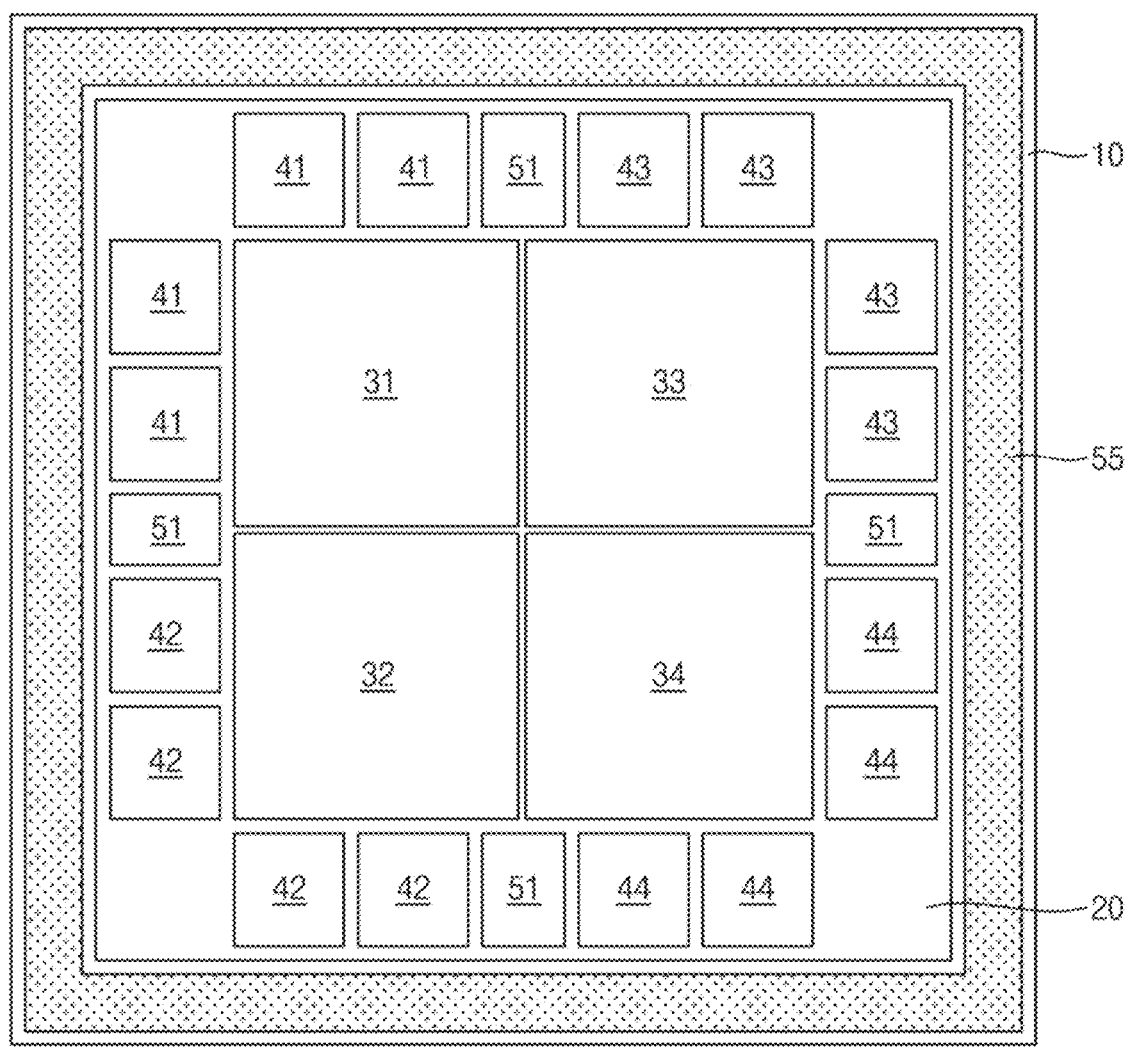

Referring to FIG. 6E, the semiconductor package 100Fe according to some example embodiments of the disclosure may include an interposer 20 disposed on a substrate 10, a plurality of logic chips 31 to 34, memory stacks 41 to 44, and stiffening chips 51. For example, the logic chips 31 to 34 may be arranged in the form of a lattice or windows. The memory stacks 41 to 44 may be disposed around the logic chips 31 to 34. For example, the memory stacks 41 to 44 may be disposed around the logic chips 31 to 34 such that four memory stacks are allocated to each logic chip. The stiffening chips 51 may be disposed to be aligned and overlap with extension lines of boundary areas (boundary lines) of the logic chips 31 to 34. For example, each stiffening chip 51 may be disposed between corresponding ones of the memory stacks 41 to 44 while being aligned with another stiffening chip 51 in one of row and column directions. Referring to FIG. 6F, the semiconductor package 100Ff according to some example embodiments of the disclosure may further include a stiffening dam 55.

Semiconductor packages according to example embodiments of the disclosure may include a stiffening structure and, as such, may have superior resistance against physical stress such as warpage.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising: a substrate; an interposer on the substrate; and
a first logic chip and a second logic chip on the interposer, the first logic chip and the second logic chip are side-by-side so as to be adjacent to each other;

memory stacks including a plurality of stacked memory chips, each memory stack is adjacent to a corresponding one of the first logic chip and the second logic chip, the memory stacks on the interposer; and dummy chips on the interposer, the dummy chips between corresponding ones of the memory stacks, the dummy chips aligned with and overlapping a boundary area between the first logic chip and the second logic chip, wherein each of the dummy chips have a greater width than the boundary area such that a respective one of the dummy chips overlaps with a portion of the first logic chip and a portion of the second logic chip in a row direction, and wherein a minimum distance between the first logic chip and the second logic chip is smaller than a minimum distance between the memory stacks.

2. The semiconductor package according to claim 1, wherein widths of the dummy chips are equal to widths of the memory stacks.

3. The semiconductor package according to claim 1, wherein shorter sides of the dummy chips have a length corresponding to ½ or less of a length of longer sides of the memory stacks when viewed in a top view.

4. The semiconductor package according to claim 1, wherein longer sides of the dummy chips have a smaller length than shorter sides of the memory stacks when viewed in a top view.

5. The semiconductor package according to claim 1, wherein a minimum distance between the first logic chip and the second logic chip is smaller than a minimum distance between the first and second logic chips and the memory stacks.

6. The semiconductor package according to claim 1, wherein a minimum distance between the first and second logic chips and the dummy chips is greater than a minimum distance between the first and second logic chips and the memory chips.

7. The semiconductor package according to claim 1, wherein a minimum distance between the dummy chips and the memory stacks is smaller than a minimum distance between the memory stacks.

8. The semiconductor package according to claim 1, further comprising:
   chip bumps between the interposer and the dummy chips physically connecting and fixing the interposer and the dummy chips; and
   a chip underfill surrounding the chip bumps.

9. The semiconductor package according to claim 1, further comprising:
   an adhesive layer between the interposer and the dummy chips physically bonding and fixing the interposer and the dummy chips.

10. The semiconductor package according to claim 1, further comprising:
   chip bumps between the interposer and the first and second logic chips and between the interposer and the memory stacks;
   a chip underfill surrounding the chip bumps;
   interposer bumps between the substrate and the interposer;
   an interposer underfill surrounding the interposer bumps; and
   substrate bumps on a lower surface of the substrate,
   wherein the chip bumps are smaller than the interposer bumps, and
   wherein the substrate bumps are larger than the interposer bumps.

11. The semiconductor package according to claim 1, wherein
   each of the memory stacks includes through vias extending vertically through the plurality of stacked memory chips; and
   the through vias are electrically connected to the interposer through chip bumps between the interposer and the memory stacks.

12. The semiconductor package according to claim 11, wherein
   the interposer includes an interposer wiring and an interposer via; and
   the first logic chip and the second logic chip are electrically connected through the interposer wiring and the interposer via.

13. The semiconductor package according to claim 1, wherein
   the memory stacks includes
      two first memory stacks at a first side surface of the first logic chip,
      two second memory stacks at a second side surface of the first logic chip,
      two third memory stacks at a first side surface of the second logic chip, and
      two fourth memory stacks at a second side surface of the second logic chip; and
   the dummy chips include
      a first stiffening chip between adjacent ones of the first memory stacks and the third memory stacks, and
      a second stiffening chip between adjacent ones of the second memory stacks and the fourth memory stacks.

14. The semiconductor package according to claim 1, further comprising:
   a stiffening dam on the substrate surrounding the interposer.

15. The semiconductor package according to claim 14, wherein
   the stiffening dam has a frame shape surrounding the first logic chip, the second logic chip, the memory stacks and the dummy chips; and
   an upper end of the stiffening dam is lower than upper ends of the first logic chip, the second logic chip and the memory stacks.

16. The semiconductor package according to claim 1, further comprising:
   a stiffening plate on the first logic chip and the second logic chip,
   wherein the stiffening plate overlaps with the boundary area between the first logic chip and the second logic chip, and
   wherein the stiffening plate is a segment extending horizontally.

17. The semiconductor package according to claim 1, further comprising:
   a molding compound covering the interposer, the first and second logic chips, the memory stacks and the dummy chips.

18. The semiconductor package according to claim 17, further comprising:
   a cover covering upper and side surfaces of the molding compound.

19. A semiconductor package comprising:
   a substrate;
   an interposer on the substrate;
   first and second logic chips on the interposer such that the first and second logic chips are adjacent to each other, the first and second logic chips being electrically connected through a wiring inside the interposer;

first memory stacks at opposite side surfaces of the first logic chip, and second memory stacks at opposite side surfaces of the second logic chip; and dummy chips between the first memory stacks and the second memory stacks, wherein a minimum distance between the first logic chip and the second logic chip is smaller than a minimum distance between the first memory stacks and the second memory stacks, wherein the dummy chips are adjacent to a boundary area between the first logic chip and the second logic chip and aligned with an extension line of the boundary area, and wherein the dummy chips have a greater width than the boundary area such that a respective one of the dummy chips overlaps with a portion of the first logic chip and a portion of the second logic chip in a row direction, and wherein a minimum distance between the first logic chip and the second logic chip is smaller than a minimum distance between the first memory stacks and a minimum distance between the second memory stacks.

20. A semiconductor package comprising:

a substrate;

an interposer on the substrate;

a plurality of logic chips on the interposer, adjacent to one another within 100 mm, and the logic chips are electrically connected through the interposer;

a plurality of memory stacks on the interposer, each of the memory stacks includes a plurality of stacked memory chips, and through vias extending vertically through the memory chips; and a plurality of dummy chips on the interposer, longer sides of the dummy chips are parallel to shorter sides of the memory stacks, shorter sides of the dummy chips have a length corresponding to ½ or less of a length of longer sides of the memory stacks, and each of the dummy chips has a greater width than a boundary area between corresponding ones of the logic chips such that a respective one of the plurality of dummy chips horizontally overlaps with portions of the corresponding logic chips; and a molding compound surrounding side surfaces of the interposer, side surfaces of the logic chips, side surfaces of the memory stacks and side surfaces of the dummy chips, wherein a minimum distance between the logic chips is smaller than a minimum distance between the memory stacks.

* * * * *